US012795959B2

(12) United States Patent
Chou et al.

(10) Patent No.: US 12,795,959 B2
(45) Date of Patent: Nov. 10, 2026

(54) METAL-INSULATOR-METAL (MIM) CAPACITORS WITH IMPROVED RELIABILITY

(71) Applicant: Taiwan Semiconductor Manufacturing Company, Ltd., Hsin-Chu (TW)

(72) Inventors: Chia-Yueh Chou, Taoyuan City (TW); Hsiang-Ku Shen, Hsinchu City (TW); Chen-Chiu Huang, Taichung City (TW); Dian-Hau Chen, Hsinchu (TW); Cheng-Hao Hou, Hsinchu City (TW); Kun-Yu Lee, Tainan City (TW); Ming-Ho Lin, Taipei City (TW); Alvin Universe Tang, Hsinchu City (TW); Chun-Hsiu Chiang, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 355 days.

(21) Appl. No.: 18/524,533

(22) Filed: Nov. 30, 2023

(65) Prior Publication Data

US 2025/0089277 A1 Mar. 13, 2025

Related U.S. Application Data

(60) Provisional application No. 63/582,019, filed on Sep. 12, 2023.

(51) Int. Cl.
*H10D 1/68* (2025.01)
*H10P 14/43* (2026.01)
(Continued)

(52) U.S. Cl.
CPC ............... *H10D 1/68* (2025.01); *H10P 14/43* (2026.01); *H10P 14/69391* (2026.01);
(Continued)

(58) Field of Classification Search
CPC .......... H10D 1/68; H10D 1/684; H10D 1/692; H10D 1/696; H10P 14/69391;
(Continued)

(56) References Cited

U.S. PATENT DOCUMENTS

| | | | | |
|---|---|---|---|---|
| 6,919,244 B1 * | 7/2005 | Remmel | .............. | H10D 84/206 257/E27.025 |
| 10,290,701 B1 * | 5/2019 | Chang | .................... | H10D 1/696 |

(Continued)

FOREIGN PATENT DOCUMENTS

| | | |
|---|---|---|
| CN | 112602191 B | 4/2021 |
| TW | 202022992 A | 6/2020 |

(Continued)

OTHER PUBLICATIONS

Yu et al., "Metal-Insulator-Metal Capacitors And Methods Of Forming The Same," U.S. Appl. No. 18/188,196, Filed Mar. 22, 2023, Assignee: Taiwan Semiconductor.Manufacturing Company, Ltd., 25 pages specification, 20 pages drawings.

*Primary Examiner* — Bac H Au
(74) *Attorney, Agent, or Firm* — HAYNES AND BOONE, LLP

(57) ABSTRACT

Semiconductor structures and methods are provided. An exemplary method includes forming a first metal-insulator-metal (MIM) capacitor over a substrate and forming a second MIM capacitor over the first MIM capacitor. The forming of the first MIM capacitor includes forming a first conductor plate over a substrate, the first conductor plate comprising a first metal element, conformally depositing a first dielectric layer on the first conductor plate, the first dielectric layer comprising the first metal element, forming a first high-K dielectric layer on the first dielectric layer, conformally depositing a second dielectric layer on the first high-K dielectric layer, the second dielectric layer comprising a second metal element, and forming a second conductor (Continued)

plate over the second dielectric layer, the second conductor plate comprises the second metal element.

20 Claims, 21 Drawing Sheets

(51) Int. Cl.
*H10P 14/692* (2026.01)
*H10P 50/26* (2026.01)
*H10W 20/40* (2026.01)

(52) U.S. Cl.
CPC .. *H10P 14/69392* (2026.01); *H10P 14/69394* (2026.01); *H10P 14/69395* (2026.01); *H10P 14/69397* (2026.01); *H10P 50/264* (2026.01); *H10W 20/496* (2026.01)

(58) Field of Classification Search
CPC ......... H10P 14/69392; H10P 14/69394; H10P 14/69395; H10P 14/69397; H10W 20/496
See application file for complete search history.

(56) References Cited

U.S. PATENT DOCUMENTS 10,707,179 B1* 7/2020 Wu ........................ H10D 1/692
2007/0152295 A1* 7/2007 Yeh ..................... H01L 23/5223 257/516
2015/0298161 A1 10/2015 Beeckman
2017/0278921 A1* 9/2017 Chen ...................... H10D 1/692
2018/0240863 A1* 8/2018 Ando ..................... H10D 1/692
2019/0131385 A1* 5/2019 Huang ................... H01G 4/224
2020/0035779 A1* 1/2020 Huang .............. H01L 21/31116
2021/0098564 A1* 4/2021 Yin ................... H01L 23/53295
2021/0100103 A1* 4/2021 Chung ................ G06F 9/30189
2021/0143248 A1* 5/2021 Allman .................. H10D 1/694
2021/0159224 A1* 5/2021 Shen ...................... H10D 1/696
2021/0359082 A1* 11/2021 Kang ..................... H10B 53/30
2022/0278191 A1* 9/2022 Lai ...................... H01L 23/5223
2022/0359644 A1* 11/2022 Hsiao ..................... H10D 1/043
2022/0367605 A1* 11/2022 Yin ......................... H10D 1/684
2023/0154843 A1* 5/2023 Chen ................... H01L 23/5226 257/532
2023/0163163 A1* 5/2023 Chen ...................... H10D 1/042 257/532
2023/0352395 A1* 11/2023 Chiu ...................... H10D 1/692
2023/0395647 A1* 12/2023 Lin ........................ H10D 1/042
2024/0088204 A1* 3/2024 Yu .......................... H10D 1/692
2024/0128312 A1* 4/2024 Shen ...................... H10D 1/042
2024/0429156 A1* 12/2024 Chou .................. H01L 23/5226
2025/0078895 A1* 3/2025 Rikimaru ................. G06G 7/60

FOREIGN PATENT DOCUMENTS

TW 202129890 A 8/2021
TW 202236527 A 9/2022

* cited by examiner

METAL-INSULATOR-METAL (MIM) CAPACITORS WITH IMPROVED RELIABILITY

PRIORITY

This application claims the priority of U.S. Provisional Application Ser. No. 63/582,019 filed Sep. 12, 2023, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-insulator-metal (MIM) capacitors are among examples of such passive devices. A typical MIM capacitor includes multiple conductor plates that are insulated from one another by multiple insulator layers. Although existing MIM capacitors and the fabrication processes thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
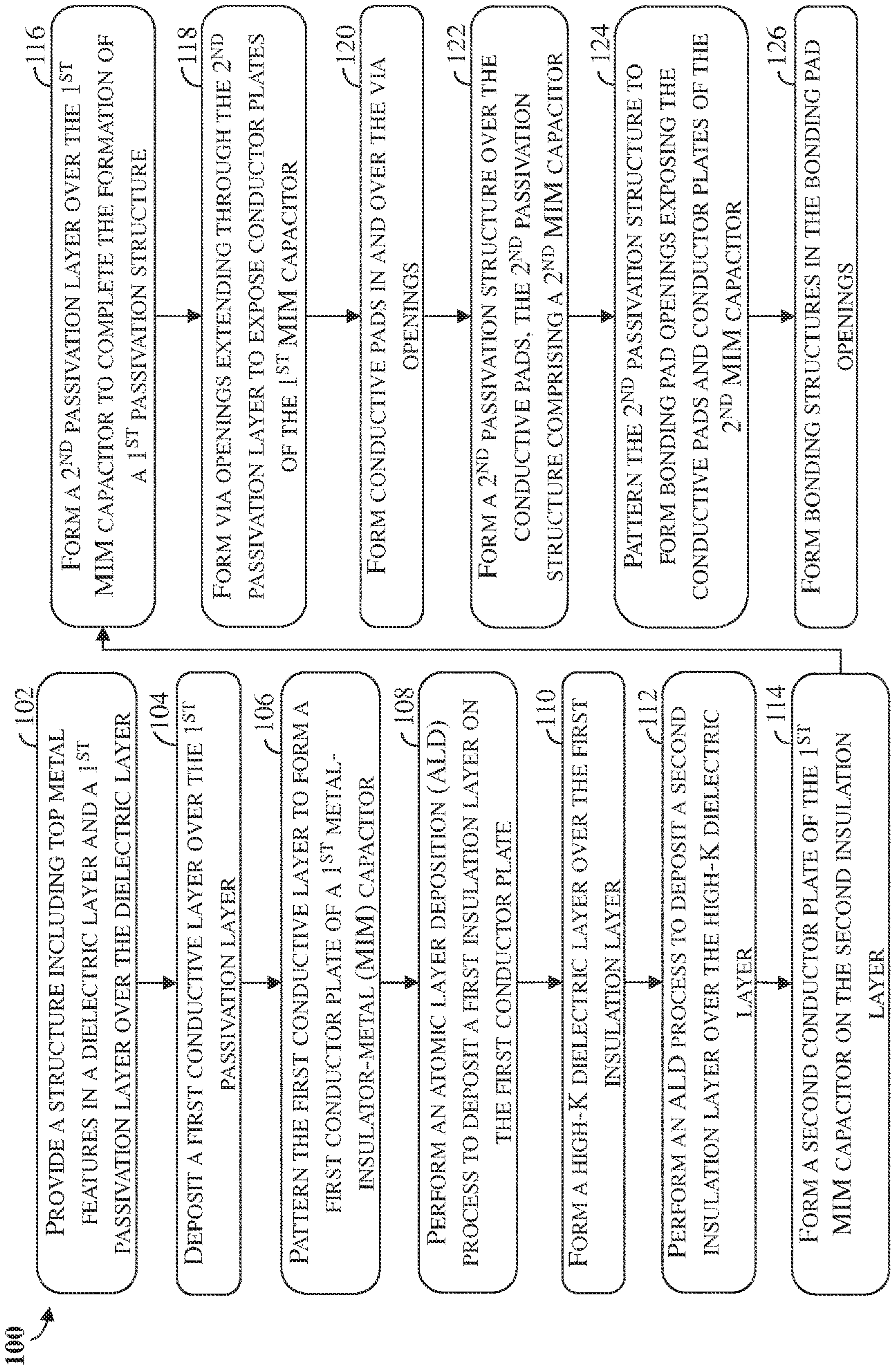
FIG. 1 is a flow chart of a method for fabricating a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-insulator-metal (MIM) capacitors have been widely used in functional circuits such as mixed signal circuits, analog circuits, Radio Frequency (RF) circuits, Dynamic Random-Access Memories (DRAMs), and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. Nowadays, MIM capacitors are also implemented in high-performance computing (HPC). Those MIM capacitors implemented in HPC may need high capacitances. As its name suggests, an MIM capacitor includes a sandwich structure of interleaving conductor plates and insulation layers. In an example, an MIM capacitor includes multiple conductor plates, each of which is insulated from an adjacent conductor plate by an insulation layer. In some existing technologies, an MIM capacitor includes a first conductor plate, a high-K dielectric layer over and in direct contact with the first conductor plate, and a second conductor plate over and in direct contact with the high-K dielectric layer. The interface quality between the first/second conductor plate and the high-K dielectric layer encompasses factors such as oxygen vacancies, impurities, and/or dangling bonds that disadvantageously affect the time-dependence-dielectric-breakdown (TDDB) performance of the MIM capacitor. For example, for embodiments in which the high-K dielectric layer includes oxygen element (e.g., hafnium-zirconium oxide (HZO)) and the first/second conductor plate includes metal element, the metal from the first/second conductor plate and the oxygen from the high-K dielectric layer may react to form a non-stoichiometric metal oxide layer at the interface between the first/second conductor plate and the high-K dielectric layer. This non-stoichiometric metal oxide layer may contain vacancies and has a poor film quality, which disadvantageously affect the TDDB performance of the MIM capacitor. Although existing MIM capacitors may be generally satisfactory in providing high capacitances, they may have short lifetime since the insulation layers (e.g., the non-stoichiometric metal oxide layer) disposed between two adjacent conductor plates undergo time-dependence-dielectric-breakdown (TDDB) failure.

The present disclosure provides metal-insulator-metal (MIM) capacitors having improved TDDB performance and methods of forming the same. In an exemplary embodiment, a method of forming the MIM capacitor includes depositing a first conductive layer over a substrate, performing an etching process to pattern the first conductive layer to form a first conductor plate, performing a first atomic layer deposition (ALD) process to form a first metal oxide layer on the first conductive layer, forming a high-K dielectric layer (e.g., hafnium-zirconium oxide (HZO) layer) over the ALD-formed first metal oxide layer, performing a second atomic layer deposition (ALD) process to form a second metal oxide layer over the high-K dielectric layer, and then forming a second conductor layer on the ALD-formed second metal oxide layer. The first metal oxide layer and the first conductor plate include the same metal element, and the second metal oxide layer and the second conductor layer include the same metal element. Forming the ALD-formed metal oxide layer between the conductor plate and the high-K dielectric layer may substantially prevent the formation of a non-stoichiometric metal oxide layer at the interface between the conductor plate and the high-K dielectric layer. Thus, TDDB performance of the MIM capacitor may be advantageously improved.

The various aspects of the present disclosure will now be described in more detail with reference to the figures. In that regard, FIG. 1 is a flowchart illustrating a method 100 for fabricating a semiconductor structure, according to embodiments of the present disclosure. Method 100 is described below in conjunction with FIGS. 2-16, 17A-17C, 18 and 19A-19B, which are fragmentary cross-sectional views of a workpiece 200 at different stages of fabrication according to embodiments of method 100. Because the workpiece 200 will be fabricated into a semiconductor structure at the conclusion of the fabrication processes, the workpiece may also be referred to as a semiconductor structure 200, as the context requires. Method 100 is merely an example and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Additionally, throughout the present application, like reference numerals denote like features, unless otherwise excepted.

Figure 2:
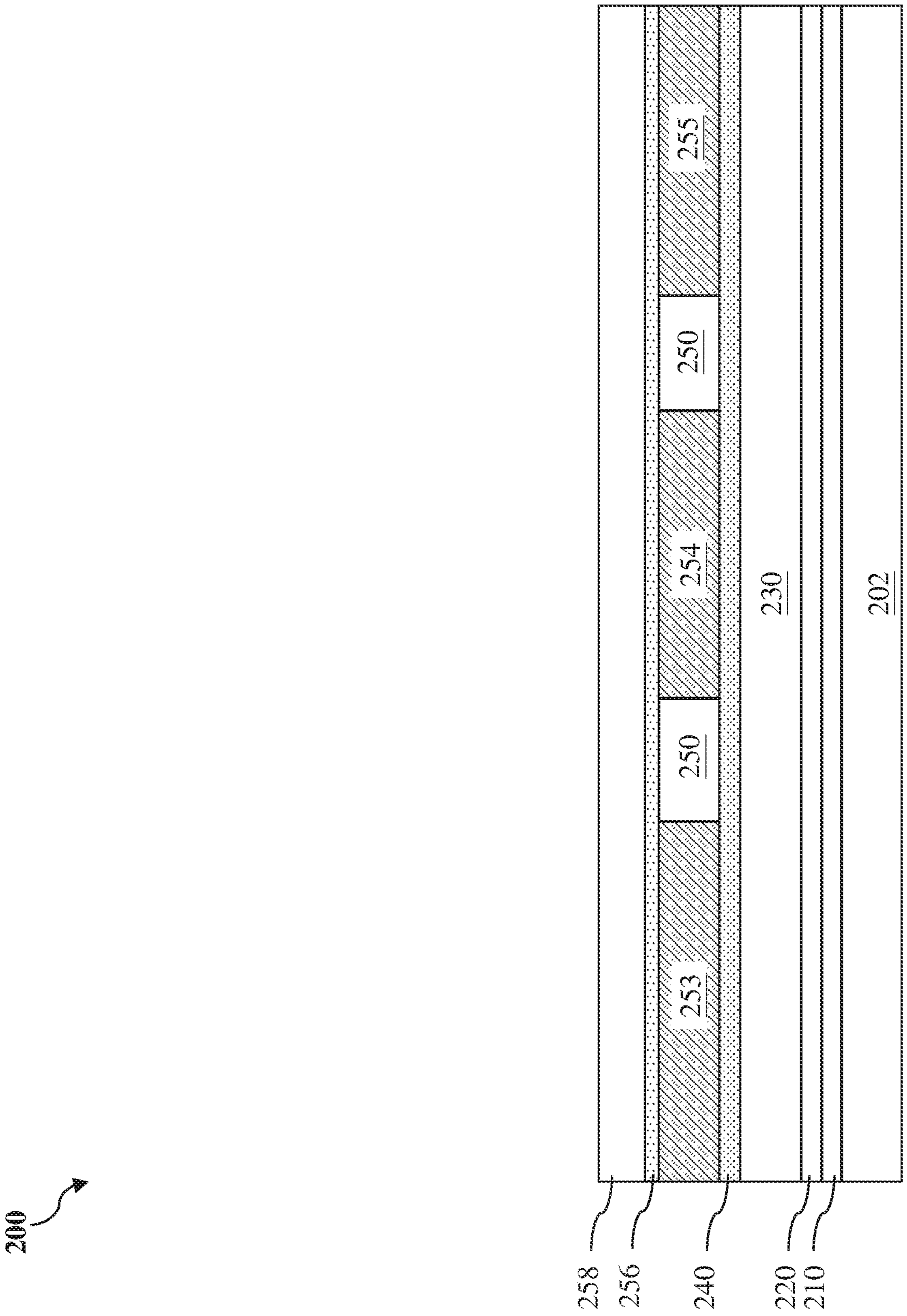
FIGS. 2, 3, 4, 5, 6, 7, 8, 9, 10, 11, 12, 13, 14, and 15 illustrate fragmentary cross-sectional views of a semiconductor structure (or workpiece) during various fabrication stages in the method of FIG. 1, according to various aspects of the present disclosure.

Referring to FIGS. 1 and 2, method 100 includes a block 102 where a semiconductor structure 200 is provided. The semiconductor structure 200 includes a substrate 202, which may be made of silicon or other semiconductor materials such as germanium. The substrate 202 may also include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Source/drain feature(s) may refer to a source or a drain, individually or collectively dependent upon the context. Transistors formed on the substrate 202 may be planar devices or multi-gate devices. Multi-gate devices include, for example, fin-like field effect transistors (FinFETs) or nanostructure transistors. A FinFET has an elevated channel wrapped by a gate on more than one side (for example, the gate wraps a top and sidewalls of a "fin" of semiconductor material extending from a substrate). A nanostructure transistor has a gate structure that can extend, partially or fully, around a channel region to provide access to the channel region on two or more sides. Because its gate structure surrounds the channel regions, a nanostructure transistor may also be referred to as a gate-all-around (GAA) transistor.

The semiconductor structure 200 also includes a multi-layer interconnect (MLI) structure 210, which provides interconnections (e.g., wiring) between the various microelectronic components of the semiconductor structure 200. The MLI structure 210 may also be referred to as an interconnect structure 210. The MLI structure 210 may include multiple metal layers or metallization layers. In some instances, the MLI structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, combinations thereof, or other suitable materials. The conductive components may be formed of any suitable conductive materials.

In an embodiment, the semiconductor structure 200 also includes a carbide layer 220 deposited on the MLI structure 210. The deposition process includes chemical vapor deposition (CVD), physical vapor deposition (PVD), atomic layer deposition (ALD), or combinations thereof. Any suitable type of carbide material such as silicon carbide (SiC) can be used in the carbide layer 220. In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In an embodiment, the oxide layer 230 includes undoped silicon oxide.

The semiconductor structure 200 also includes an etch stop layer (ESL) 240 disposed on the oxide layer 230. The ESL 240 may include silicon carbonitride (SiCN), silicon oxycarbide (SiOC), silicon carbide (SiC), silicon oxycarbonitride (SiOCN), or silicon nitride (SiN), or combinations thereof and may be formed by chemical vapor deposition (CVD), physical vapor deposition (PVD), atomic layer deposition (ALD), or combinations thereof.

The semiconductor structure 200 also includes a dielectric layer 250 deposited on the ESL 240. A composition of the dielectric layer 250 may be similar to that of the oxide layer 230. In some embodiments, the dielectric layer 250 includes undoped silica glass (USG) or silicon oxide. The dielectric layer 250 may be deposited using CVD, flowable CVD (FCVD), spin-on coating, PVD, ALD, or combinations thereof.

The semiconductor structure 200 also includes a number of lower contact features (e.g., a lower contact feature 253, a lower contact feature 254, and a lower contact feature 255) formed in the dielectric layer 250. The formation of the lower contact features may include patterning of the dielectric layer 250 to form trenches and deposition of a barrier layer and a metal fill layer in the trenches. In some embodiments, the barrier layer may include titanium nitride or tantalum nitride and may be conformally deposited using PVD, CVD, metalorganic CVD (MOCVD), or a suitable method. In one embodiment, the barrier layer may include tantalum nitride. The metal fill layer includes a metal or metal alloy such as copper (Cu), cobalt (Co), nickel (Ni), aluminum (Al), tungsten (W), ruthenium (Ru), titanium (Ti), or combinations thereof. After the barrier layer and the metal fill layer are deposited, a planarization process, such as a chemical mechanical planarization (CMP) process, may be performed to remove excess portions of barrier layer and metal fill layer to form the lower contact features 253, 254 and 255. Although the lower contact features 253, 254, and 255 are disposed below upper conductive pads (such as conductive pads **280*a* and 280*b*), the lower contact features 253, 254, and 255 are sometimes referred to as top metal (TM) contacts 253, 254, and 255**, respectively.

The semiconductor structure 200 also includes an etch stop layer 256 formed directly on the dielectric layer 250. In an embodiment, the etch stop layer 256 is deposited on the dielectric layer 250 by chemical vapor deposition (CVD), physical vapor deposition (PVD), atomic layer deposition (ALD), or combinations thereof. The etch stop layer 256 may include silicon carbonitride (SiCN), silicon nitride (SiN), other suitable materials, or combinations thereof. In the present embodiments, the etch stop layer 256 is in direct contact with top surfaces of the lower contact features 253, 254, and 255.

The semiconductor structure 200 also includes a first passivation layer 258 deposited over the etch stop layer 256. The first passivation layer 258 may include any suitable material (e.g., silicon nitride) and may be deposited using plasma-enhanced CVD (PECVD). Gaseous precursors used to form the first passivation layer 258 may include ammonia ($NH_3$), silane ($SiH_4$), and nitrogen ($N_2$).

Figure 3:
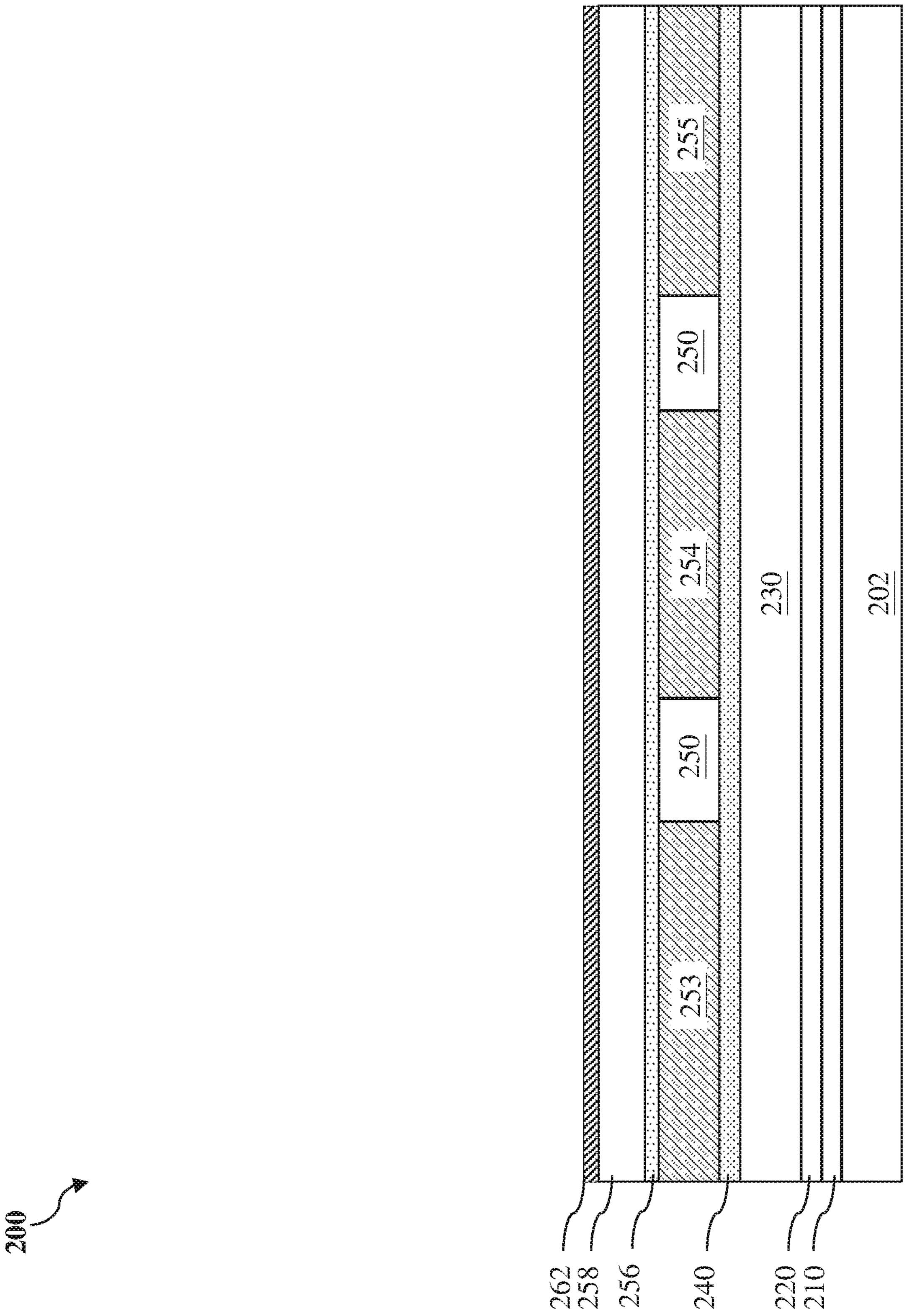

Referring to FIGS. 1 and 3, method 100 includes a block 104 where a first conductive layer 262 is deposited over the first passivation layer 258. The first conductive layer 262 may be deposited on the first passivation layer 258 using PVD, CVD, ALD, or MOCVD. In some embodiments, the first conductive layer 262 may include titanium (Ti), tantalum (Ta), titanium nitride (TiN), tantalum nitride (TaN), copper (Cu), cobalt (Co), nickel (Ni), tungsten (W), aluminum (Al), or other suitable materials.

Figure 4:
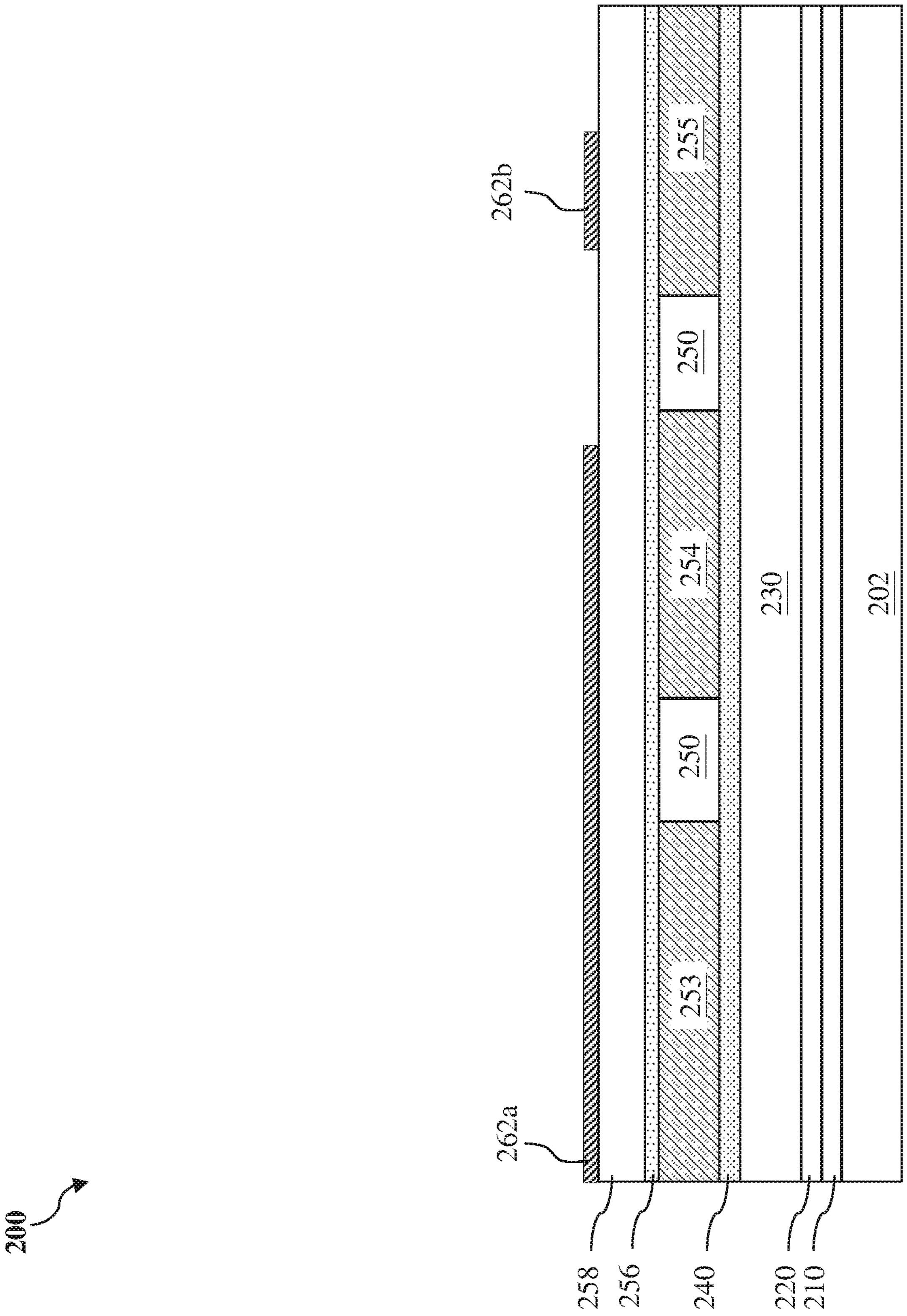

Referring to FIGS. 1 and 4, method 100 includes a block 106 where the first conductive layer 262 is patterned to form a first conductor plate **262*a* and a dummy conductive feature 262*b*. In the depicted example, the first conductor plate 262*a* is disposed directly over the lower contact feature 253, and the dummy conductive feature 262*b* is disposed directly over the lower contact feature 255. The patterning may include deposition of a hard mask layer over the first conductive layer 262, formation of a photoresist layer over the hard mask layer, patterning of the photoresist layer using photolithography, etching of the hard mask layer using the patterned photoresist layer as an etch mask, and then etching of the first conductive layer 262 using the patterned hard mask as an etch mask. The hard mask layer may be selectively removed after forming the first conductor plate 262*a* and the dummy conductive feature 262*b***.

Figure 5:
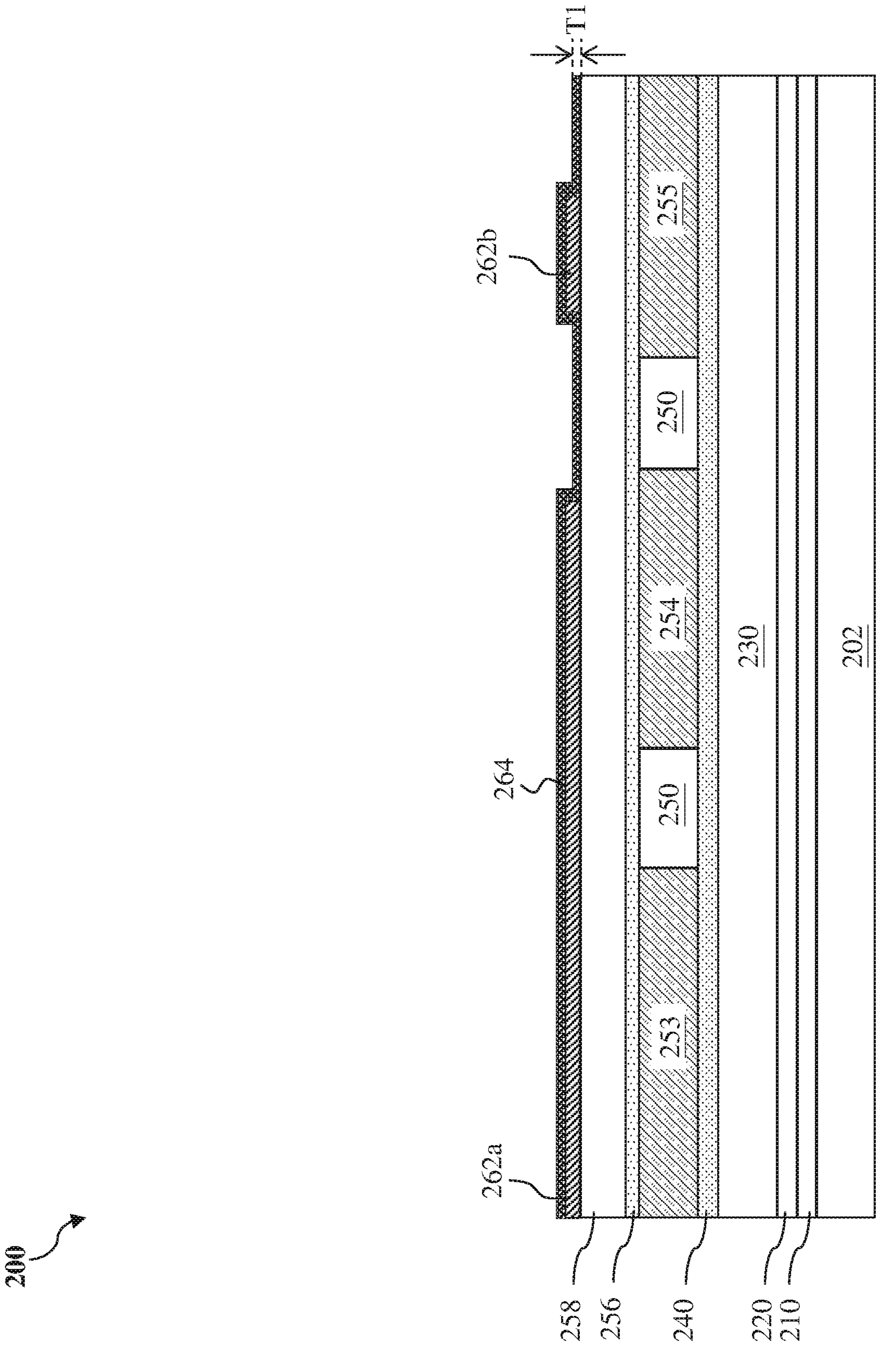

Referring to FIGS. 1 and 5, method 100 includes a block 108 where a first insulation layer 264 is deposited on the first conductor plate **262*a*. In the present embodiments, the first insulation layer 264 is conformally deposited over the semiconductor structure 200 to have a generally uniform thickness T1 over the top surface of the semiconductor structure 200 (e.g., having about the same thickness on top and sidewall surfaces of the first conductor plate 262*a* and the dummy conductive feature 262*b*). In an embodiment, an atomic layer deposition (ALD) process is performed to form the first insulation layer 264 with high film quality. To reduce lattice mismatch and reduce film lamination, the first insulation layer 264 and the first conductor plate 262*a* have the same metal element. For example, for embodiments in which the first conductor plate 262*a* is formed of aluminum, the first insulation layer 264 is formed of aluminum oxide having a fixed stoichiometric ratio (i.e., $Al_2O_3$); for embodiments in which the first conductor plate 262*a* is formed of titanium nitride, the first insulation layer 264** is formed of titanium oxide having a fixed stoichiometric ratio (i.e., $TiO_2$).

Figure 6:
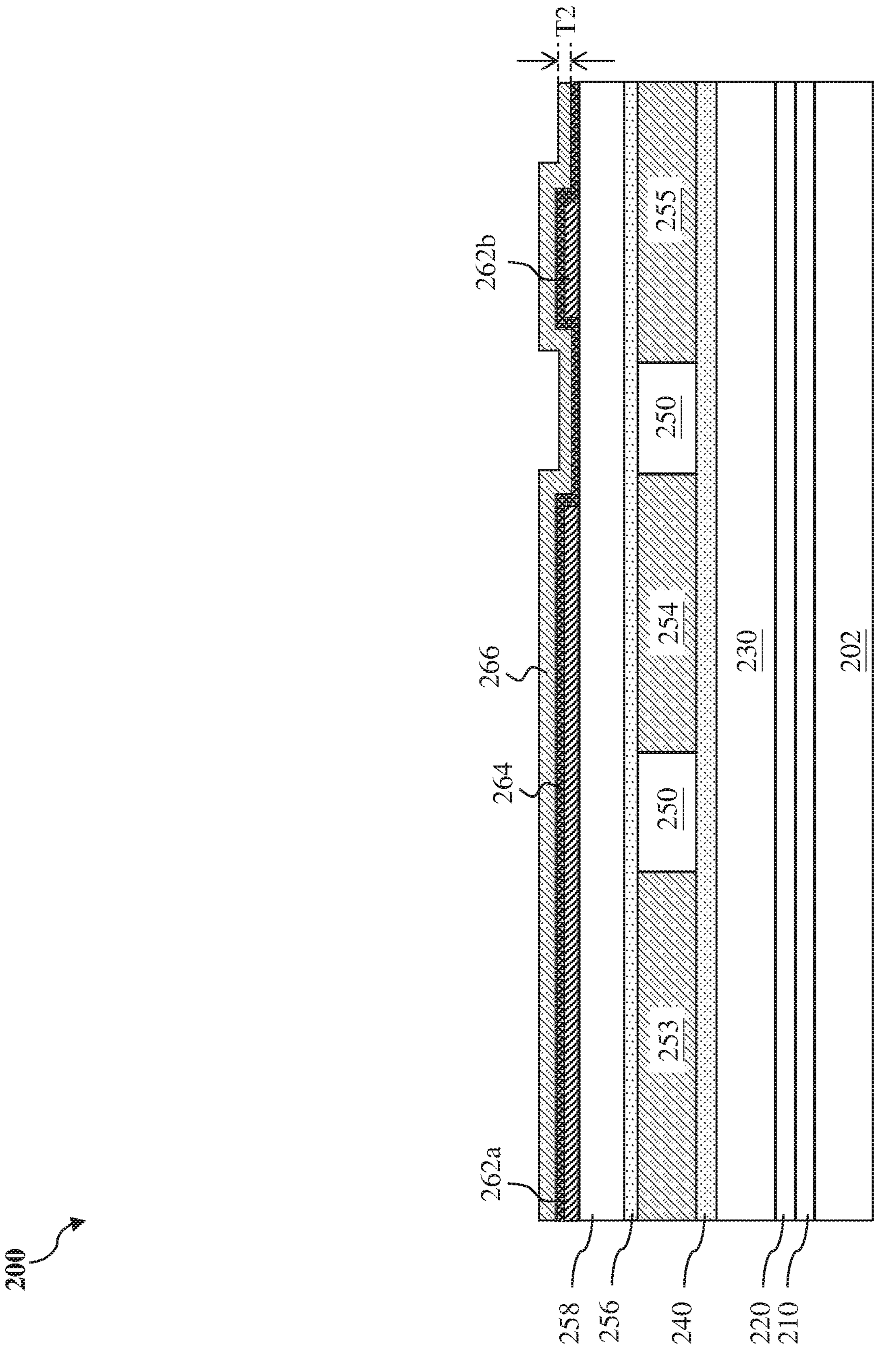

Referring to FIGS. 1 and 6, method 100 includes a block 110 where a high-K dielectric layer 266 is deposited over the first insulation layer 264. In some embodiments, the high-K dielectric layer 266 is conformally formed to have a generally uniform thickness T2 over the top surface of the semiconductor structure 200 (e.g., having about the same thickness on top and sidewall surfaces of the first insulation layer 264). In an embodiment, the high-K dielectric layer 266 includes hafnium-zirconium oxide (HZO) and is deposited using thermal atomic layer deposition (ALD) implementing halide precursors at a temperature between about 200° C. and about 400° C. The high-K dielectric layer 266 may include any other suitable materials. In the present embodiments, the high-K dielectric layer 266 is spaced apart from the first conductor plate 262*a* by the first insulation layer 264. To enhance forward bias related TDDB without substantially increasing the distance between two adjacent conductor plates to reduce a capacitance of the MIM capacitor, a ratio of the thickness T1 to the thickness T2 may be in a range between about 1/10 and about 1/2. If the ratio is greater than 1/2, the distance between two adjacent conductor plates will be significantly increased, leading to a large decrease in the capacitance of the first MIM capacitor 272. If the ratio is less than 1/10, the first insulation layer 264 may be not able to prevent or substantially reduce the chemical reaction between the first conductor plate 262*a* and the high-K dielectric layer 266 to prevent the formation of the native non-stoichiometric metal oxide layer that has a poor film quality to substantially improve the TDDB related performance.

Figure 7:
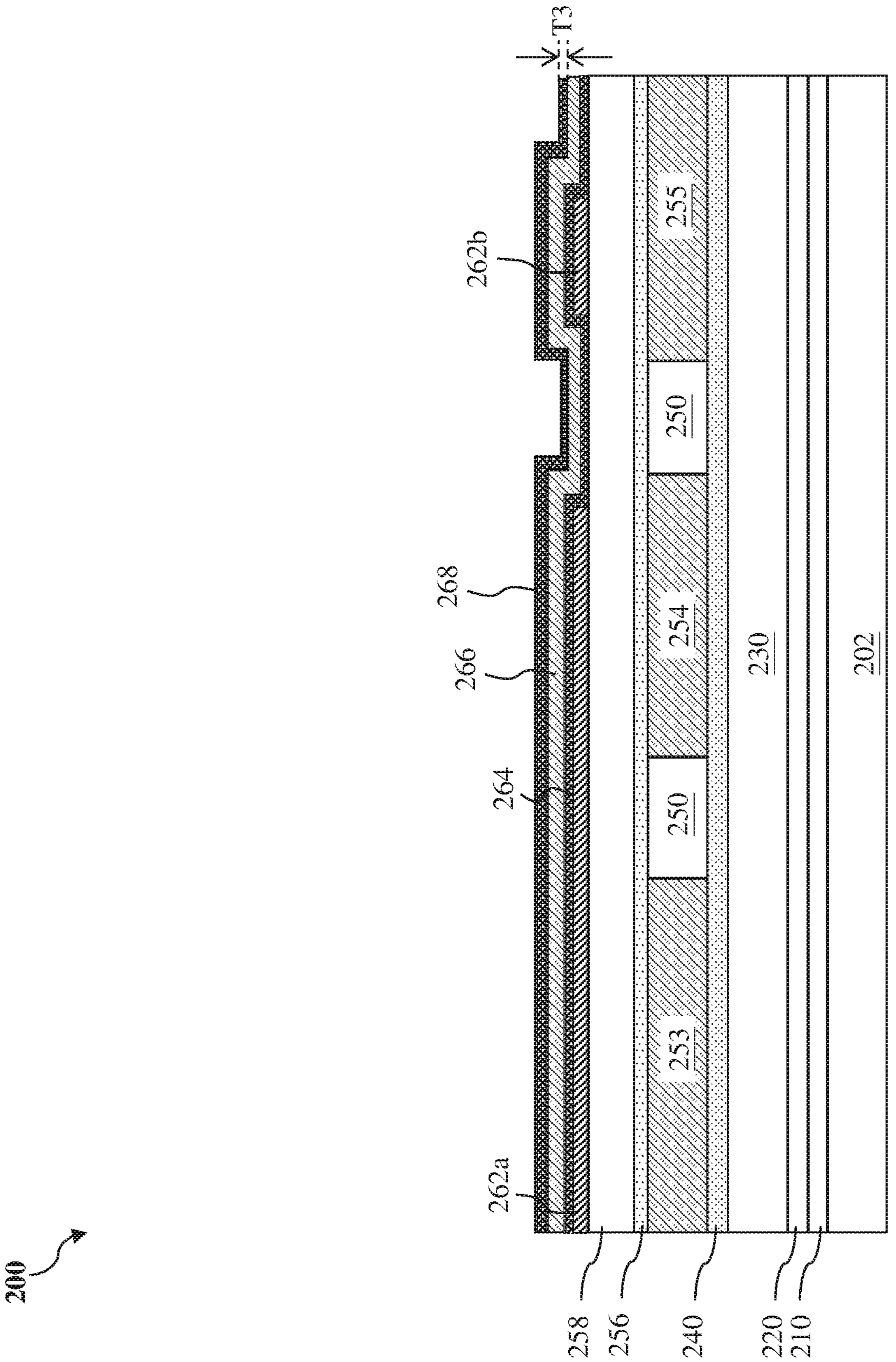

Referring to FIGS. 1 and 7, method 100 includes a block 112 where a second insulation layer 268 is deposited over the high-K dielectric layer 266. In the present embodiments, the second insulation layer 268 is conformally deposited over the semiconductor structure 200 to have a generally uniform thickness T3 over the top surface of the semiconductor structure 200 (e.g., having about the same thickness over top and sidewall surfaces of the high-K dielectric layer 266). In an embodiment, an ALD process is performed to form the second insulation layer 268 with high film quality. To reduce lattice mismatch and thus reduce film lamination, the second insulation layer 268 and the second conductor plate 270 that will be formed on the second insulation layer 268 have the same metal element. For example, for embodiments in which the second conductor plate 270 is formed of aluminum, the second insulation layer 268 is formed of aluminum oxide having a fixed stoichiometric ratio (i.e., $Al_2O_3$); for embodiments in which the second conductor plate 270 is formed of titanium nitride, the second insulation layer 268 is formed of titanium oxide having a fixed stoichiometric ratio (i.e., $TiO_2$). For similar reasons stated above, a ratio of the thickness T3 to the thickness T2 may be in a range between about 1/10 and about 1/2. In an embodiment, the thickness T3 is substantially equal to the thickness T1.

Figure 8:
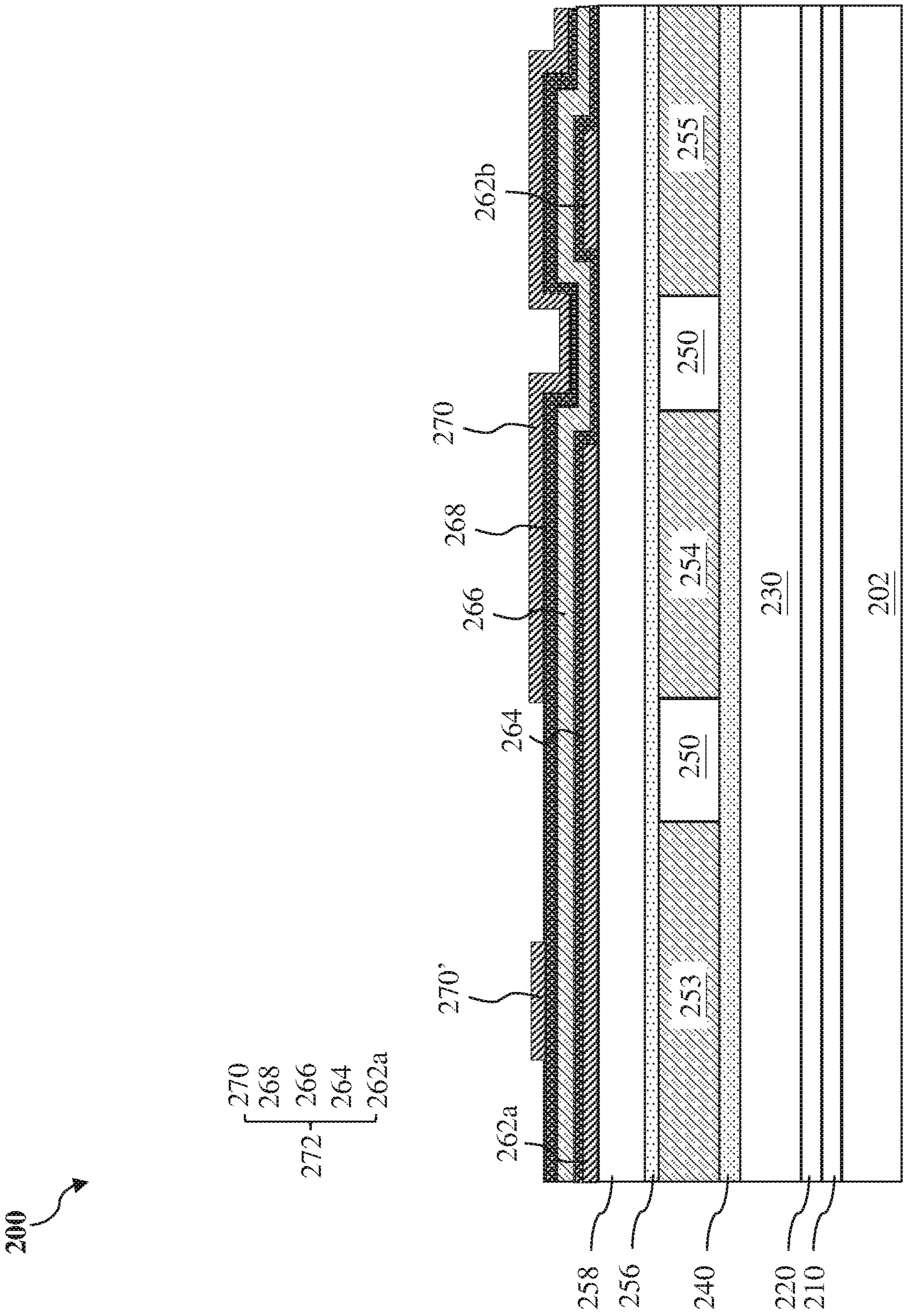

Referring to FIGS. 1 and 8, method 100 includes a block 114 where a second conductor plate 270 is formed on the second insulation layer 268. The second conductor plate 270 is vertically overlapped with the first conductor plate 262*a* and is spaced apart from the high-K dielectric layer 266 by the second insulation layer 268. A composition and formation of the second conductor plate 270 may be similar to those of the first conductor plate 262*a*. For example, a conductive layer may be deposited on second insulation layer 268 using PVD, CVD, ALD, or MOCVD and may include titanium (Ti), tantalum (Ta), titanium nitride (TiN), tantalum nitride (TaN), copper (Cu), cobalt (Co), nickel (Ni), tungsten (W), aluminum (Al), or other suitable materials. The conductive layer is then patterned to form the second conductor plate 270 and a dummy conductive feature 270'. In an embodiment, the second conductor plate 270 is formed of aluminum. In another embodiment, the second conductor plate 270 is formed of titanium nitride. After the formation of the second conductor plate 270, the structure of a MIM capacitor 272 is finalized. It is understood that the first MIM capacitor 272 may have different configurations. For example, the first MIM capacitor 272 may include other suitable number of conductor plates (e.g., three, four, or more), and each of the conductor plate is isolated from a high-K dielectric layer by an ALD-formed metal oxide layer that contains a metal element same to the corresponding conductor plate.

Figure 9:
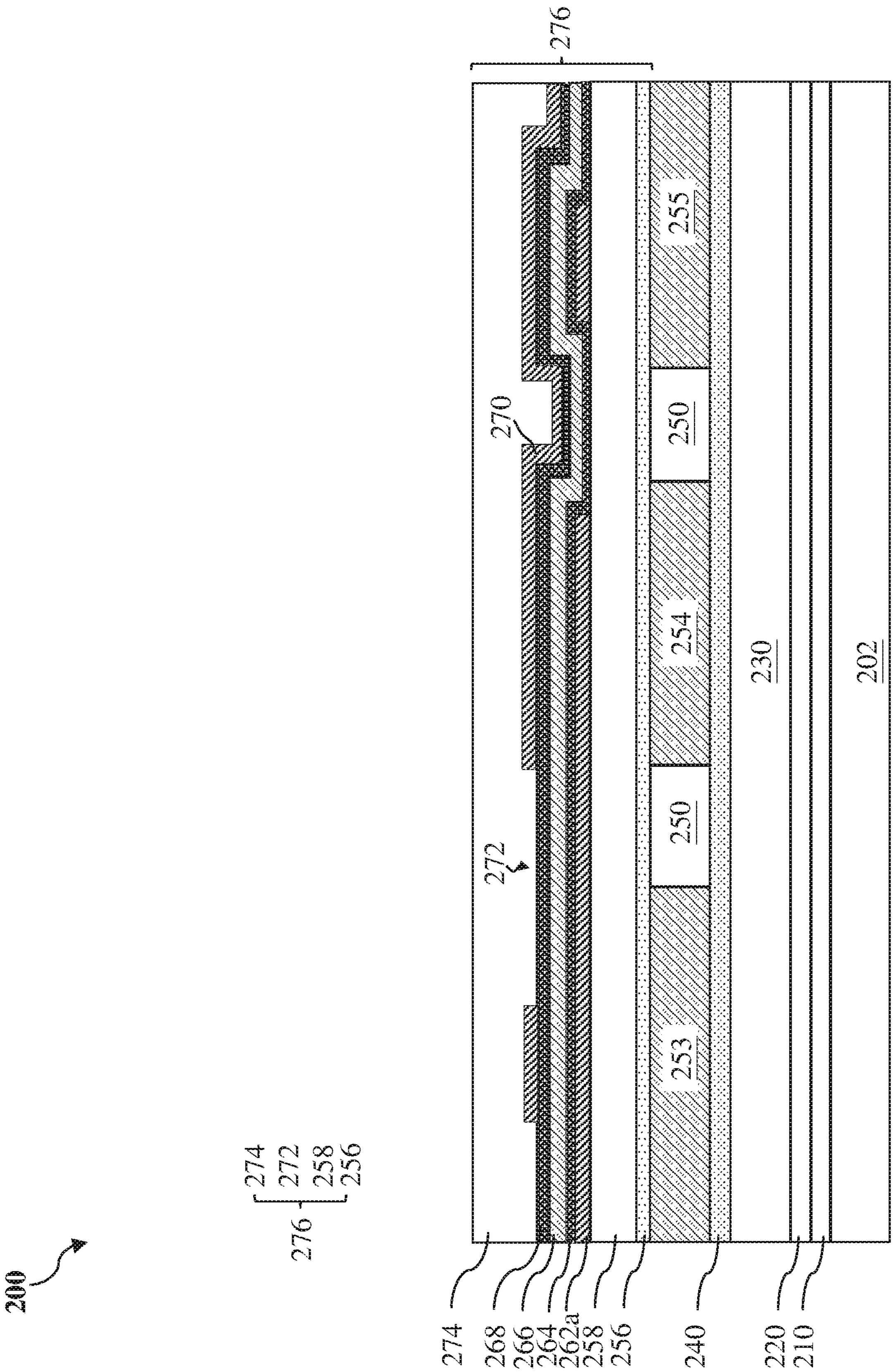

Referring to FIGS. 1 and 9, method 100 includes a block 116 where a second passivation layer 274 is formed over the first MIM capacitor 272. In some embodiments, the second passivation layer 274 may include a dielectric layer or two or more dielectric layers formed by any suitable materials such as silicon oxide or silicon nitride and may be formed by any suitable deposition processes (e.g., plasma-enhanced chemical vapor deposition (PECVD)). As shown in FIG. 9, the first MIM capacitor 272 is sandwiched between the second passivation layer 274 and first passivation layer 258. The first passivation layer 258 and the second passivation layer 274 protect the first MIM capacitor 272 from damage due to stress or crack propagation. In some embodiments, the etch stop layer 256, the first passivation layer 258, the first MIM capacitor 272, and the second passivation layer 274 may be collectively referred to as a first passivation structure 276.

Figure 10:
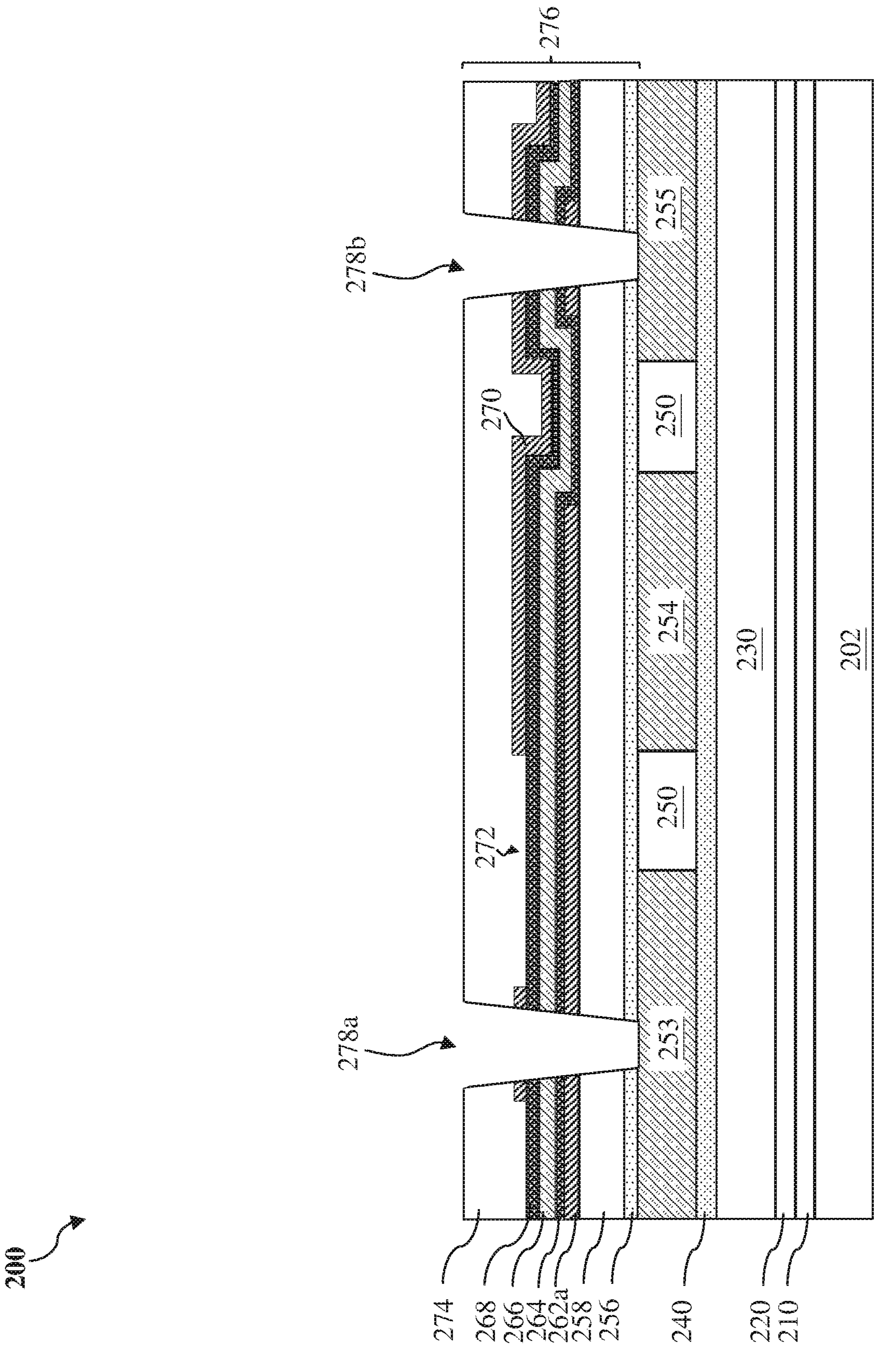

Referring to FIGS. 1 and 10, method 100 includes a block 118 where a number of via openings (such as via openings 278*a*, 278*b*) are formed to penetrate through the first passivation structure 276. In the depicted embodiment, the via opening 278*a* extends through the second passivation layer 274, the dummy conductive feature 270', the second insulation layer 268, the high-K dielectric layer 266, the first insulation layer 264, the first conductor plate 262*a*, the first passivation layer 258, and the etch stop layer 256 to expose the lower contact feature 253. The via opening 278*a* extends through the second passivation layer 274, the second conductor plate 270, the second insulation layer 268, the high-K dielectric layer 266, the first insulation layer 264, the dummy conductive layer 262*b*, the first passivation layer 258, and the etch stop layer 256 to expose the lower contact feature 255. The formation of the via openings (such as via openings 278*a*, 278*b*) involves performing a combination of lithography and etching processes. In an embodiment, the via openings 278*a* and 278*b* may be formed using dry etching, such as reactive ion etching (RIE). In some embodiments, the formation of the via openings 278*a* and 278*b* may include use of oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 11:
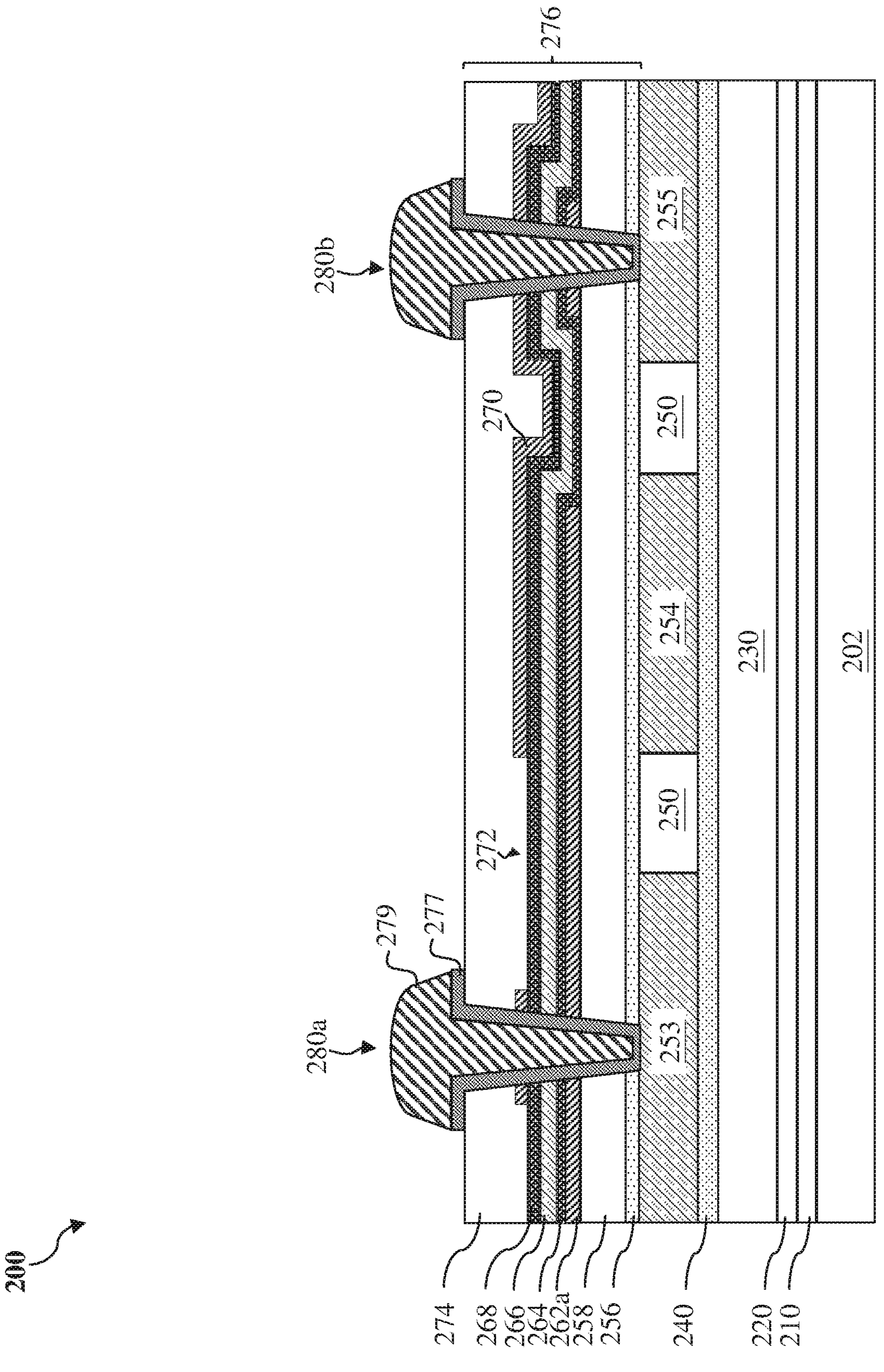

Referring to FIGS. 1 and 11, method 100 includes a block 120 where conductive pads (such as conductive pads 280*a* and 280*b*) are formed in and over the via openings (such as the via openings 278*a* and 278*b*). In an example process, a barrier layer 277 is first conformally deposited over the second passivation layer 274 and into the via openings 278*a* and 278*b* using a suitable deposition technique, such as ALD, PVD or CVD and then a metal fill layer 279 is deposited over the barrier layer 277 using ALD, PVD, CVD, electroless plating, or electroplating. The barrier layer 277 may include titanium nitride (TiN), tantalum nitride (TaN), or another metal nitride. The metal fill layer 279 may be formed of copper (Cu), aluminum (Al), aluminum copper (Al—Cu), or other suitable materials. In an embodiment, the metal fill layer 279 includes aluminum (Al), the barrier layer 277 includes tantalum nitride (TaN). A planarization process (e.g., CMP) may be then performed after depositing the metal fill layer 279. The barrier layer 277 and the metal fill layer 279 may be then patterned to form a number of conductive pads (such as conductive pads 280*a* and 280*b*) in and over the second passivation layer 274. In an example process, a photoresist layer may be formed over the barrier layer 277 and the metal fill layer 279 and then patterned, an etching process may be then performed to form the conductive pads 280*a* and 280*b* while using the patterned photoresist layer as an etch mask. In some embodiments, the conductive pads (such as conductive pads 280*a* and 280*b*) may be referred to as upper contact features or upper conductive pads and may be part of a redistribution layer (RDL) to reroute bond connections between upper and lower layers.

Figure 12:
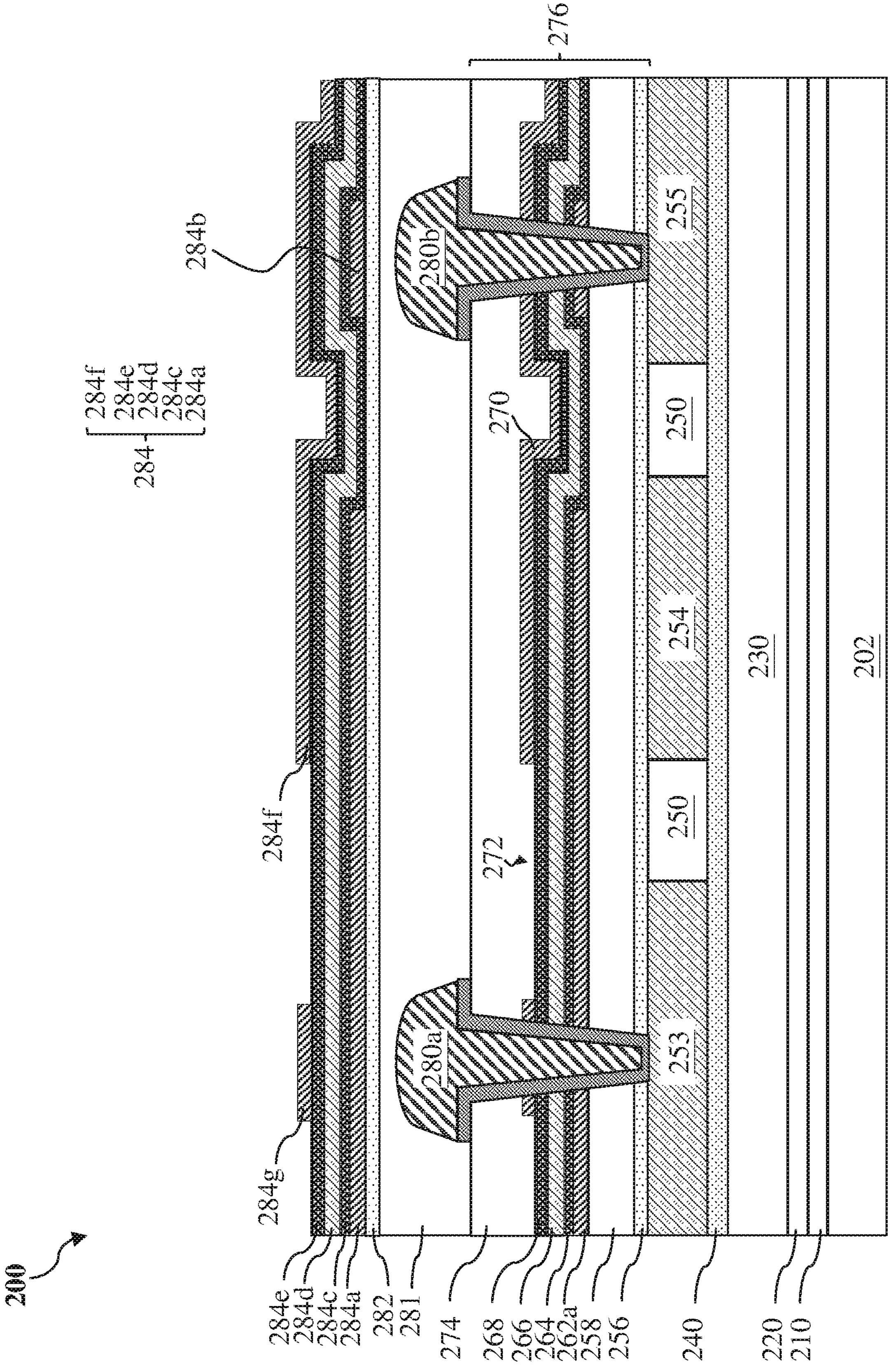
Figure 13:
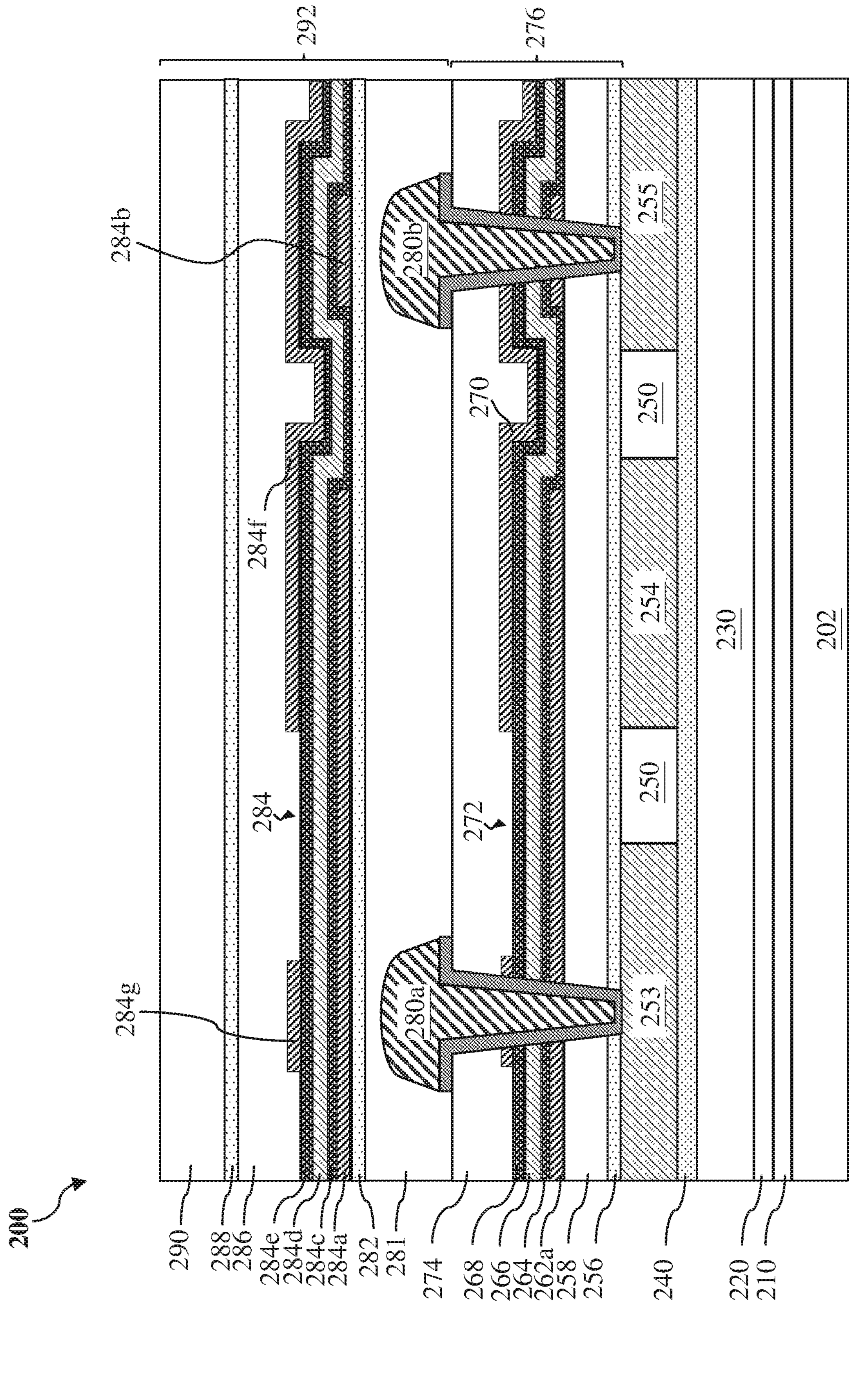

Referring to FIGS. 1 and 12-13, method 100 includes a block 122 where a second passivation structure 292 is formed over the conductive pads 280*a* and 280*b*. In the present embodiments, the second passivation structure 292 (shown in FIG. 13) is a multi-layer structure. More specially, the second passivation structure 292 includes a third passivation layer 281 (e.g., silicon nitride formed by CVD, PECVD, or a suitable method) disposed over the conductive pads 280*a* and 280*b*. A planarization process may be performed to the third passivation layer 281 to provide a planar top surface. After forming the third passivation layer 281, an etch stop layer 282 is formed directly on the third passivation layer 281. In an embodiment, the etch stop layer 282 is deposited on the third passivation layer 281 by using chemical vapor deposition (CVD), physical vapor deposition (PVD), atomic layer deposition (ALD), or combinations thereof. The etch stop layer 282 may include silicon carbonitride (SiCN), silicon nitride (SiN), other suitable materials, or combinations thereof.

The second passivation structure 292 also includes a second MIM capacitor 284 (shown in FIG. 12) formed on the etch stop layer 282. In the illustrated embodiment, the formation and composition of the second MIM capacitor 284 are substantially similar to those of the MIM capacitor 272. More specifically, a conductive layer may be deposited over the etch stop layer 282 and then patterned to form a bottom conductor plate 284*a* and a dummy conductive feature 284*b*. In the depicted example, the bottom conductor plate 284*a* is disposed directly over the lower contact feature 253, and the dummy conductive feature 284*b* is disposed directly over the lower contact feature 255. The bottom conductor plate 284*a* may include titanium (Ti), tantalum (Ta), titanium nitride (TiN), tantalum nitride (TaN), copper (Cu), cobalt (Co), nickel (Ni), tungsten (W), aluminum (Al), or other suitable materials. An insulation layer 284*c* is conformally deposited on the bottom conductor plate 284*a* by performing an ALD process. To reduce lattice mismatch and thus reduce film lamination, the insulation layer 284*c* and the bottom conductor plate 284*a* have the same metal element. For example, for embodiments in which the bottom conductor plate 284*a* is formed of aluminum, the insulation layer 284*c* is formed of aluminum oxide having a fixed stoichiometric ratio (i.e., $Al_2O_3$); for embodiments in which the bottom conductor plate 284*a* is formed of titanium nitride, the insulation layer 284*c* is formed of titanium oxide having a fixed stoichiometric ratio (i.e., $TiO_2$).

After forming the insulation layer 284*c*, a high-K dielectric layer 284*d* is conformally deposited over the insulation layer 284*c*. In an embodiment, the high-K dielectric layer 284*d* includes hafnium-zirconium oxide (HZO) and is deposited using thermal atomic layer deposition (ALD) implementing halide precursors at a temperature between about 200° C. and about 400° C. The high-K dielectric layer 284*d* may include any other suitable materials. In the present embodiments, the high-K dielectric layer 284*d* is spaced apart from the bottom conductor plate 284*a* by the insulation layer 284*c*. To enhance forward bias related TDDB without substantially increasing the distance between two adjacent conductor plates to reduce a capacitance of the MIM capacitor, a ratio of the thickness of the insulation layer 284*c* to the thickness of the high-K dielectric layer 284*d* may be in a range between about 1/10 and about 1/2. If the ratio is greater than 1/2, the distance between two adjacent conductor plates will be significantly increased, leading to a large decrease in the capacitance of the second MIM capacitor 284. If the ratio is less than 1/10, the insulation layer 284*c* may be not thick enough to prevent or substantially reduce the formation of the native non-stoichiometric metal oxide layer that has a poor film quality to substantially improve the TDDB related performance.

The second MIM capacitor 284 also includes an insulation layer 284*e* conformally deposited over the high-K dielectric layer 284*d* by performing an ALD process. The second MIM capacitor 284 also includes a top conductor plate 284*f* and a dummy conductive layer 284*g* disposed on the insulation layer 284*c*. That is, the top conductor plate 284*f* is spaced apart from the high-K dielectric layer 284*d* by the insulation layer 284*c*. A composition and formation of the top conductor plate 284*f* may be similar to those of the first conductor plate 262*a*. To reduce lattice mismatch and thus reduce film lamination, the insulation layer 284*e* and the top conductor plate 284*f* have the same metal element. For example, for embodiments in which the top conductor plate 284*f* is formed of aluminum, the insulation layer 284*e* is formed of aluminum oxide having a fixed stoichiometric ratio (i.e., $Al_2O_3$); for embodiments in which the top conductor plate 284*f* is formed of titanium nitride, the insulation layer 284*c* is formed of titanium oxide having a fixed stoichiometric ratio (i.e., $TiO_2$). For similar reasons stated above, a ratio of the thickness of the insulation layer 284*c* to the thickness of the high-K dielectric layer 284*d* may be in a range between about 1/10 and about 1/2. It is understood that the second MIM capacitor 284 may have different configurations. For example, the second MIM capacitor 284 may include other suitable number of conductor plates (e.g., three, four, or more), and each of the conductor plate is isolated from a high-K dielectric layer by an ALD-formed metal oxide layer that contains a metal element same to the corresponding conductor plate.

With reference to FIG. 13, the formation of the second passivation structure 292 also includes forming a fourth passivation layer 286 over the second MIM capacitor 284. In an embodiment, the fourth passivation layer 286 is a low-k dielectric material and includes tetraethylorthosilicate (TEOS) oxide. The formation of the second passivation structure 292 also includes forming an etch stop layer 288 on the fourth passivation layer 286. In an embodiment, the etch stop layer 288 includes silicon carbonitride (SiCN) and/or silicon nitride (SiN) and is deposited on the fourth passivation layer 286 by using chemical vapor deposition (CVD), physical vapor deposition (PVD), atomic layer deposition (ALD). The formation of the second passivation structure 292 also includes forming a fifth passivation layer 290 over the etch stop layer 288. In some embodiments, the fifth passivation layer 290 is a low-k dielectric material. In an embodiment, the fifth passivation layer 290 includes tetraethylorthosilicate (TEOS) oxide. The third passivation layer 281, the etch stop layer 282, the second MIM capacitor 284, the fourth passivation layer 286, the etch stop layer 288 and the fifth passivation layer 290 are collectively referred to as the second passivation structure 292.

Figure 14:
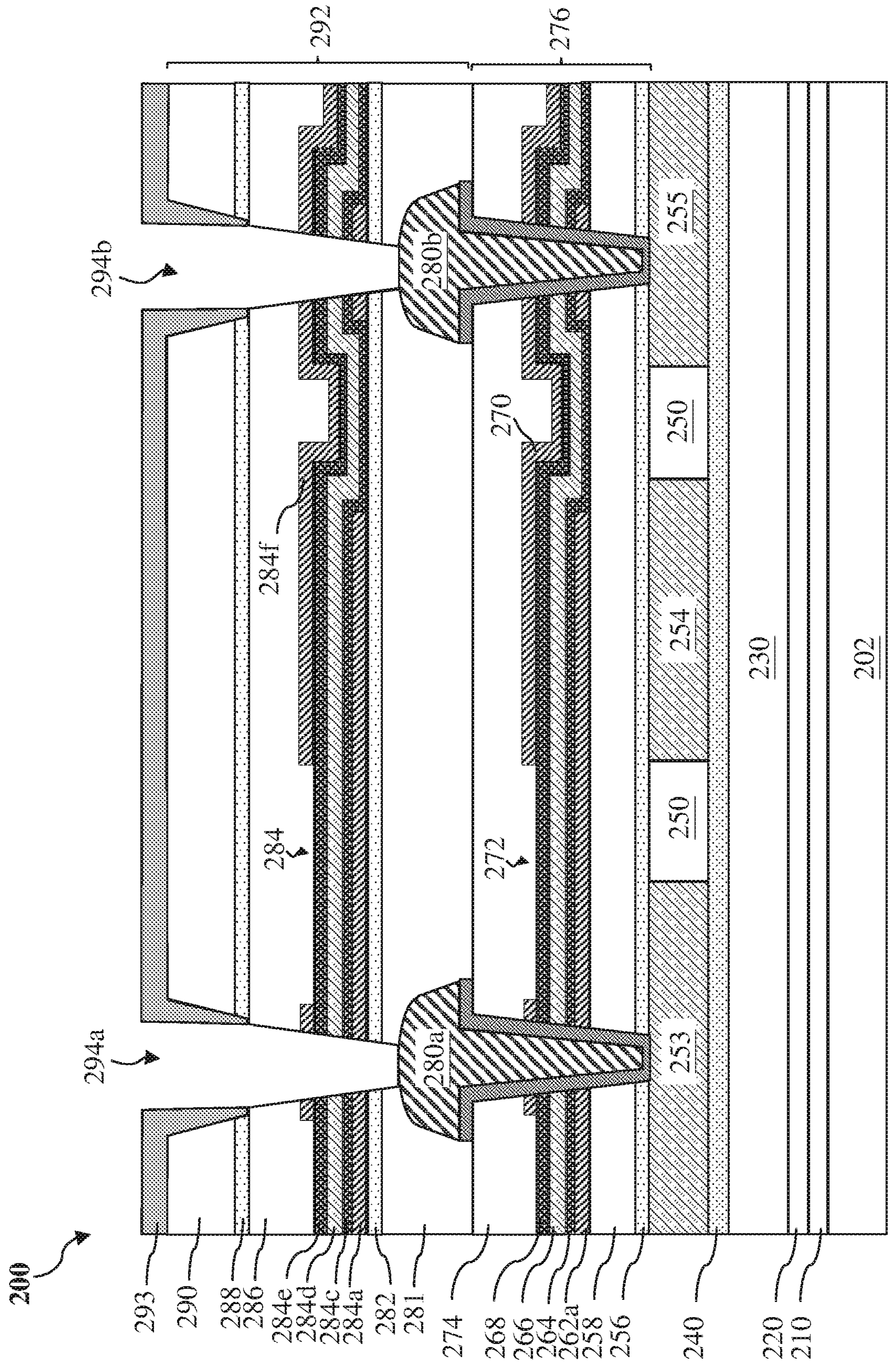

Referring to FIGS. 1 and 14, method 100 includes a block 124 where the second passivation structure 292 is patterned to form bonding pad openings (e.g., bonding pad openings 294*a* and 294*b*) to expose the conductive pads (e.g., the conductive pads 280*a* and 280*b*) and conductor plates (e.g., the conductor plates 284*a* and 284*f*) of the second MIM capacitor 284. In an example process, a combination of lithography and etching processes are performed to form openings extending through the fifth passivation layer 290 and the etch stop layer 288. The lithography process can include forming a resist layer (not shown) on the fifth passivation layer 290 (for example, by spin coating), performing a pre-exposure baking process, performing an exposure process using a mask, performing a post-exposure baking process, and performing a developing process. After development, the patterned resist layer includes a resist pattern that corresponds with the mask. While using the patterned resist layer as an etch mask, a first etching process is performed to remove portions of the fifth passivation layer 290 and the etch stop layer 288. In an embodiment, the first etching process includes a dry etching process and it stops once the etch stop layer 288 is fully etched. After the performing of the first etching process, the patterned resist layer is removed from the semiconductor structure 200, for example, by a resist stripping process. Then, a patterned mask film 293 may be formed over a top surface of the patterned fifth passivation layer 290 and sidewall surfaces of patterned fifth passivation layer 290 and the etch stop layer 288. As depicted in FIG. 14, a portion of the patterned mask film 293 is formed over and in direct contact with a portion of a top surface of the fourth passivation layer 286. A second etching process may be then performed to the second passivation structure 292 to remove other portions of the second passivation structure 292 not covered by the patterned mask film 293 to expose top surfaces of the conductive pads 280*a* and 280*b*. The patterned mask film 293 may be then selectively removed, thereby finishing the formation of the bonding pad openings 294*a* and 294*b*.

Figure 15:
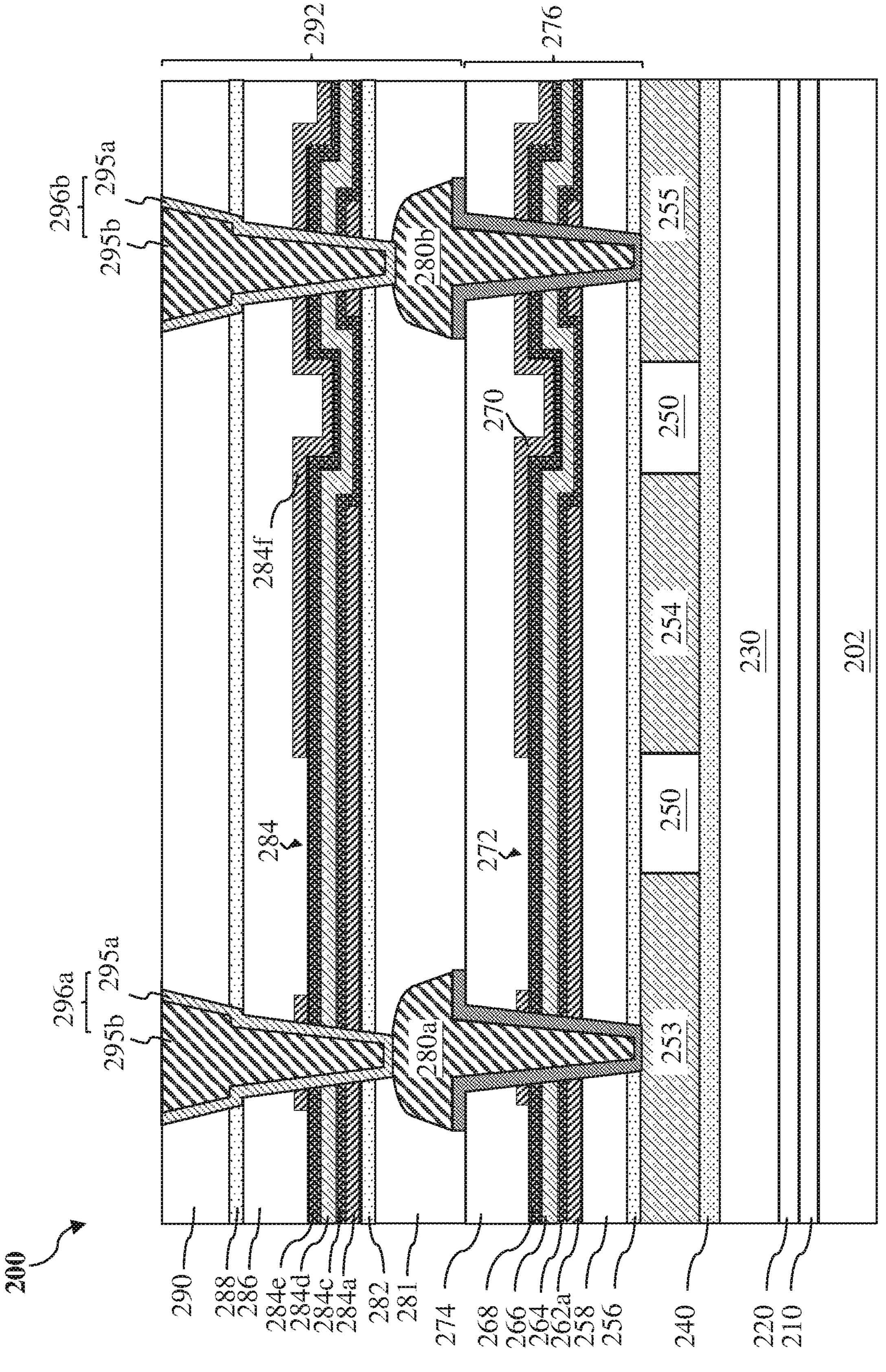

Referring to FIGS. 1 and 15, method 100 includes a block 126 where bonding structures 296*a* and 296*b* are formed in the bonding pad openings 294*a* and 294*b*, respectively. The formation of the bonding structures 296*a* and 296*b* may include conformally depositing a barrier layer 295*a* over the second passivation structure 292 and into the bonding pad openings 294*a* and 294*b* using a suitable deposition technique, such as ALD, PVD or CVD and then forming a metal fill layer 295*b* over the barrier layer 295*a* using ALD, PVD, CVD, electroless plating, or electroplating. The barrier layer 295*a* may include titanium nitride (TiN), tantalum nitride (TaN), or another metal nitride. The metal fill layer 295*b* may be formed of any suitable material, such as copper (Cu). After the deposition of the conductive material, a planarization process (e.g., CMP) may be then performed such that top surfaces of the metal fill layer 295*b* and barrier layer 295*a* are coplanar with the top surface of the second passivation structure 292. Portions of the bonding structures 296*a* and 296*b* formed in the lower portion (e.g., a portion that is under the fifth passivation layer 290) of the bonding pad openings 294*a* and 294*b* may be referred to as bonding pad vias (BPV), and portions of the bonding structures 296*a* and 296*b* formed in the upper portion (e.g., a portion that is over the etch stop layer 288) of the bonding pad openings 294*a* and 294*b* may be referred to as bonding pad metal lines (BPM). In the present embodiments, the bonding structure 296*a* extends through the bottom conductor plate 284*a* of the second MIM capacitor 284 and in direct contact with the conductive pad 280*a* which directly contacts the first conductor plate 262*a* of the first MIM capacitor 272. That is, the bottom conductor plate 284*a* of the second MIM capacitor 284 is electrically connected to the first conductor plate 262*a* of the first MIM capacitor 272. The bonding structure 296*b* extends through the top conductor plate 284*f* of the second MIM capacitor 284 and in direct contact with the conductive pad 280*b* which directly contacts the second conductor plate 270 of the first MIM capacitor 272. That is, the top conductor plate 284*f* of the second MIM capacitor 284 is electrically connected to the second conductor plate 270 of the first MIM capacitor 272. Thus, the first MIM capacitor 272 and the second MIM capacitor 284 are electrically connected in parallel, thereby providing a larger capacitance.

Figure 16:
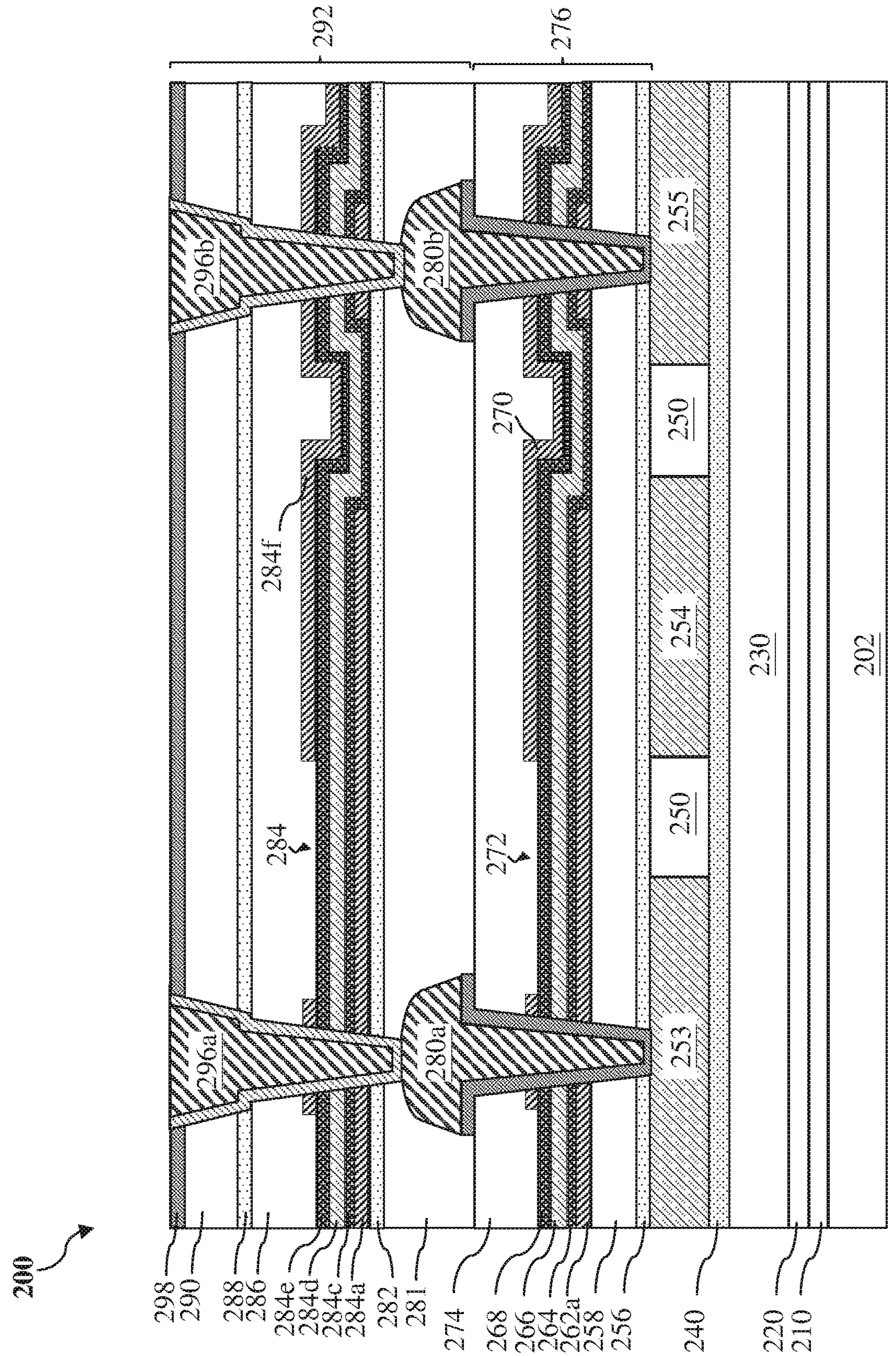
FIG. 16 depicts a fragmentary cross-sectional view of a first alternative semiconductor structure, according to various aspects of the present disclosure.
Figure 17A:
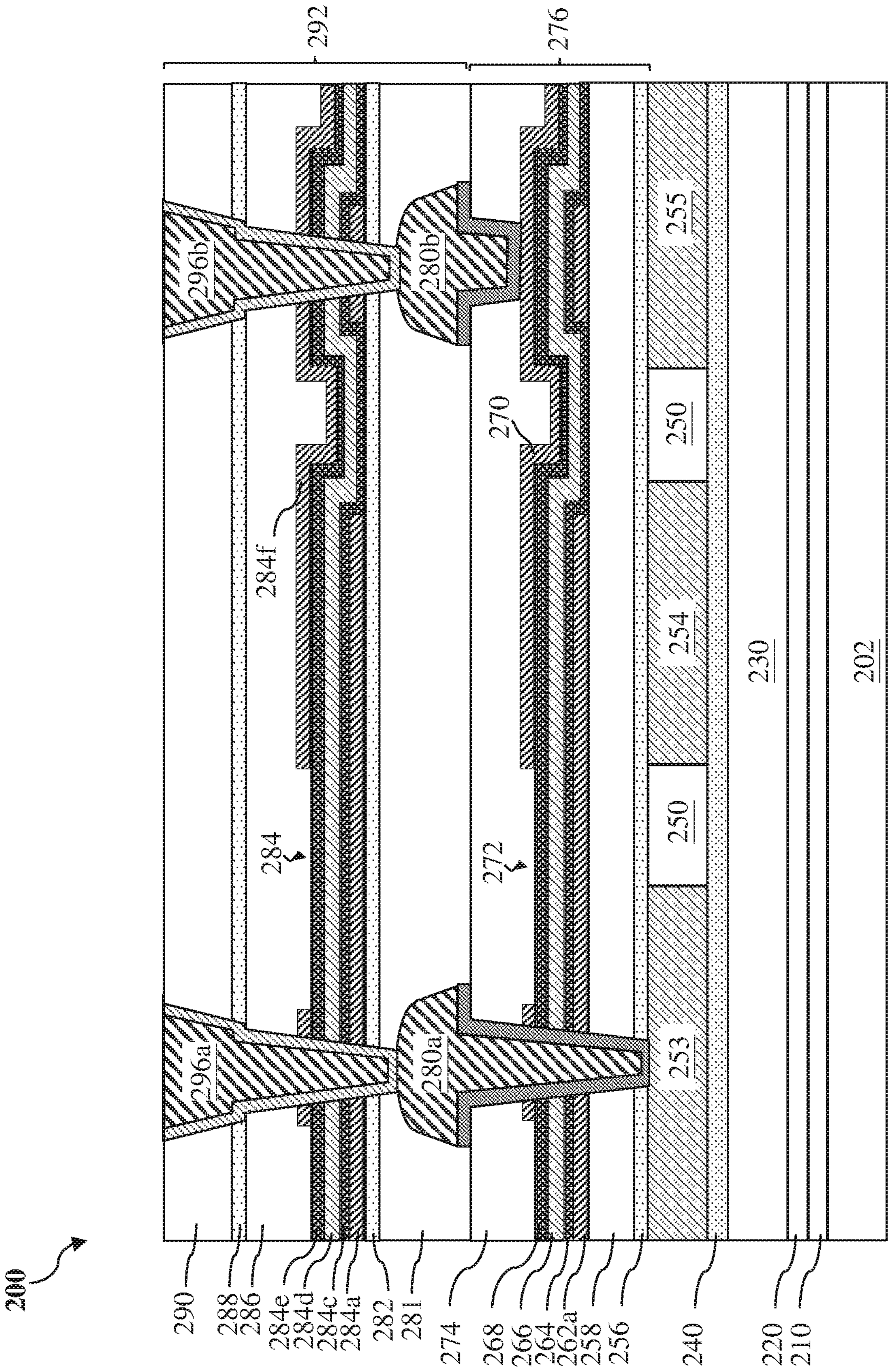
FIGS. 17A, 17B, and 17C depict fragmentary cross-sectional view of second, third, and fourth alternative semiconductor structure, according to various aspects of the present disclosure.
Figure 17B:
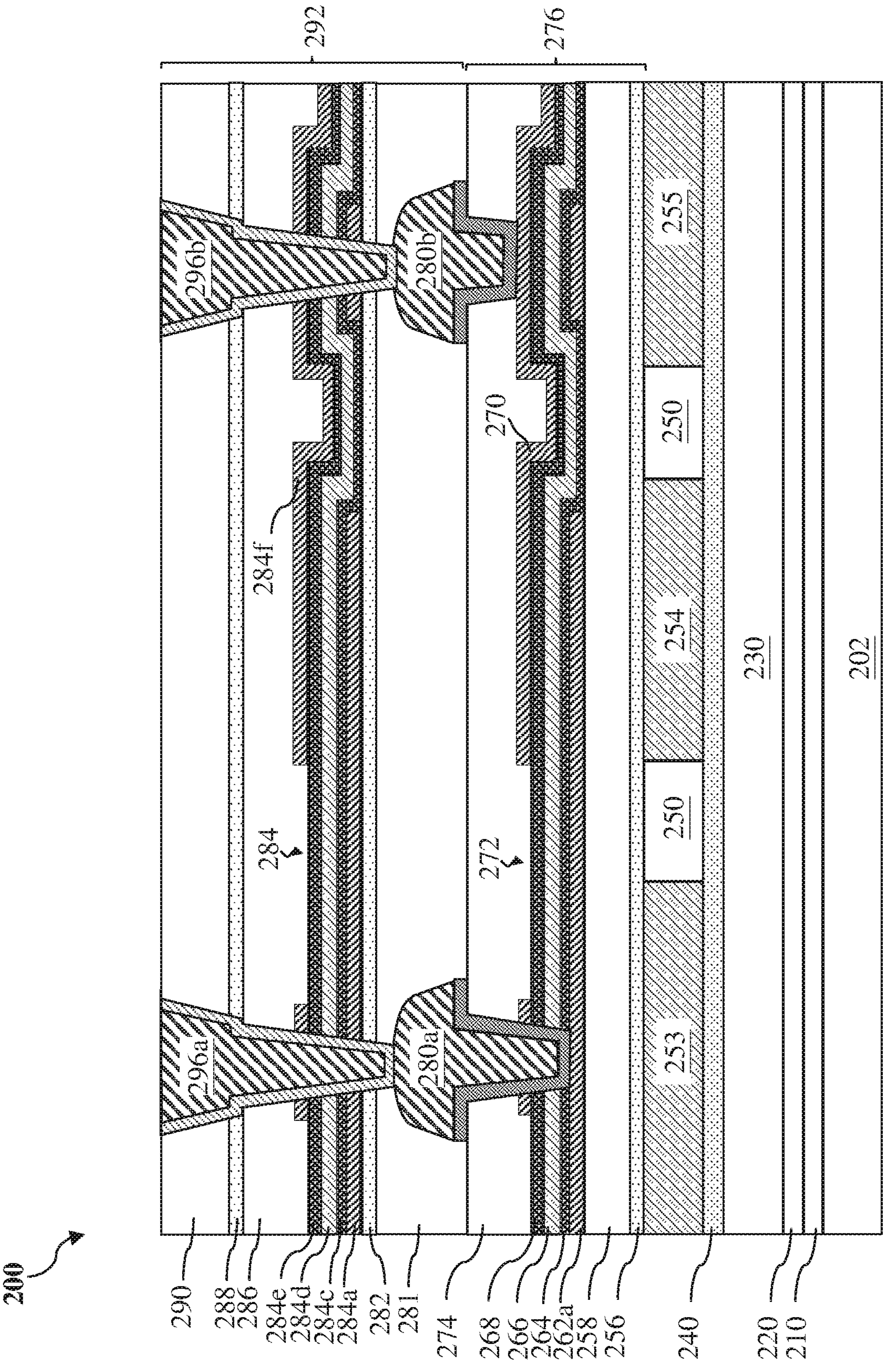
Figure 17C:
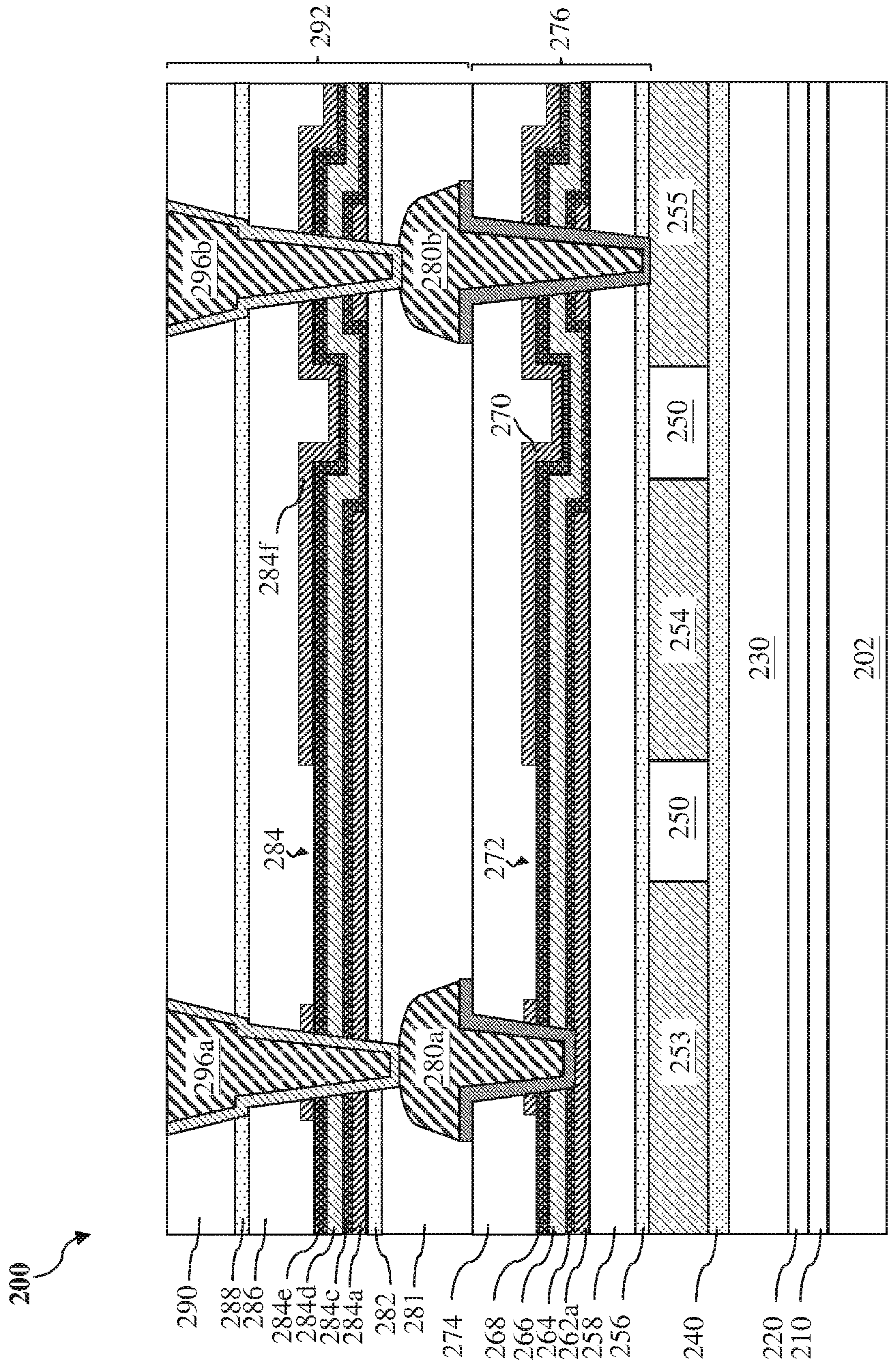

In the above embodiments, the second passivation structure 292 includes the third passivation layer 281, the etch stop layer 282, the second MIM capacitor 284, the fourth passivation layer 286, the etch stop layer 288, and the fifth passivation layer 290. In a first alternative embodiment represented by FIG. 16, the second passivation structure 292 also includes an anti-reflection layer 298 disposed on the fifth passivation layer 290. Forming the anti-reflection layer 298 may advantageously improve alignment during the formation of the bonding pad openings 294*a* and 294*b*. In some embodiments, the antireflection layer 298 is made of nitrogen-free material, such as silicon oxycarbide (SiOC), and the second passivation structure 292 (including the anti-reflection layer 298) may be then patterned to from the bonding pad openings 294*a* and 294*b*. The bonding structures 296*a* and 296*b* may be then formed in the bonding pad openings 294*a* and 294*b*. As depicted in FIG. 16, top surfaces of the bonding structures 296*a* and 296*b* are coplanar with the top surface of the anti-reflection layer 298.

In the above embodiments, both the conductive pads 280*a* and 280*b* extend through the first passivation structure 276 and in direct contact with the corresponding top metal contacts (e.g., the top metal contacts 253 and 255). In a second alternative embodiment represented by FIG. 17A, the conductive pad 280*a* extends through the first passivation structure 276 and is in direct contact with the top metal contact 253, and the conductive pad 280*b* extends through the second passivation layer 274 of the first passivation structure 276 and its bottom surface is in direct contact with the top surface of the second conductor plate 270 of the MIM capacitor 272. That is, the conductive pads 280*a* and 280*b* have different heights, and a height of the conductive pad 280*a* is greater than a height of the conductive pad 280*b*. In a third alternative embodiment represented by FIG. 17B, the conductive pad 280*a* stops on the top surface of the first conductor plate 262*a* and does not extend through the first passivation layer 258 and the etch stop layer 256, and the conductive pad 280*b* stops on the top surface of the second conductor plate 270. In a fourth alternative embodiment represented by FIG. 17C, the conductive pad 280*a* stops on the top surface of the first conductor plate 262*a* and does not extend through the first passivation layer 258 and the etch stop layer 256, and the conductive pad 280*b* extends through the first passivation structure 276 and is in direct contact with the top metal contact 255.

Figure 18:
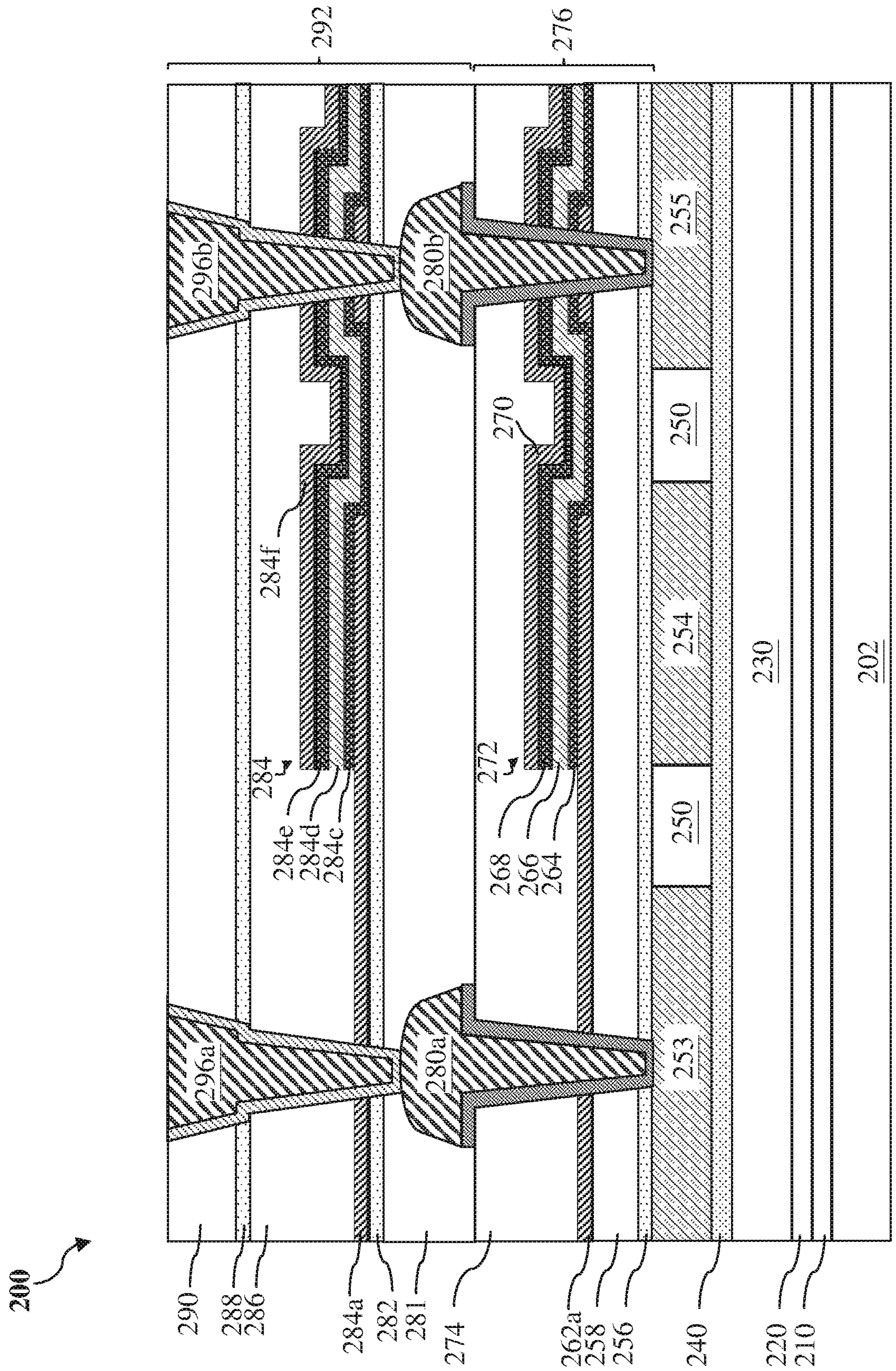
FIG. 18 depicts a fragmentary cross-sectional view of a fifth alternative semiconductor structure, according to various aspects of the present disclosure.

In some other alternative embodiments as represented by FIG. 18, after forming the first insulation layer 264, the high-K dielectric layer 266, and the second insulation layer 268 of the first MIM capacitor 272, a combination of lithography and etching processes may be performed to pattern the first insulation layer 264, the high-K dielectric layer 266 and the second insulation layer 268. Sidewall surfaces of the patterned first insulation layer 264, the patterned high-K dielectric layer 266 and the patterned second insulation layer 268 are vertically aligned with a sidewall surface of the second conductor plate 270. In some embodiments, same processes may be applied to the insulation layer 284*c*, the high-K dielectric layer 284*d* and the insulation layer 284*c* of the second MIM capacitor 284. In some other embodiments, only one of the first and second MIM capacitors 272 and 284 have the patterned dielectric structure (e.g., the combination of the first insulation layer 264, the high-K dielectric layer 266 and the second insulation layer 268; or the combination of the insulation layer 284*c*, the high-K dielectric layer 284*d* and the insulation layer 284*c*).

In the above embodiments, to substantially improve the TDDB related performance, all conductor plates of a MIM capacitor are separated from adjacent high-K dielectric layer(s) by a corresponding ALD-formed metal oxide layer. For example, for the first MIM capacitor 272, as depicted in FIG. 8, the first conductor plate 262*a* is separated from the high-K dielectric layer 266 by the ALD-formed metal oxide layer (i.e., the first insulation layer 264), and the second conductor plate 270 is spaced apart from the high-K dielectric layer 266 by the ALD-formed metal oxide layer (i.e., the second insulation layer 268); for the second MIM capacitor 284, as depicted in FIG. 12, the bottom conductor plate 284*a* is separated from the high-K dielectric layer 284*d* by the ALD-formed metal oxide layer (i.e., the insulation layer 284*c*), and the top conductor plate 284*f* is spaced apart from the high-K dielectric layer 284*d* by the ALD-formed metal oxide layer (i.e., the insulation layer 284*c*).

Figure 19A:
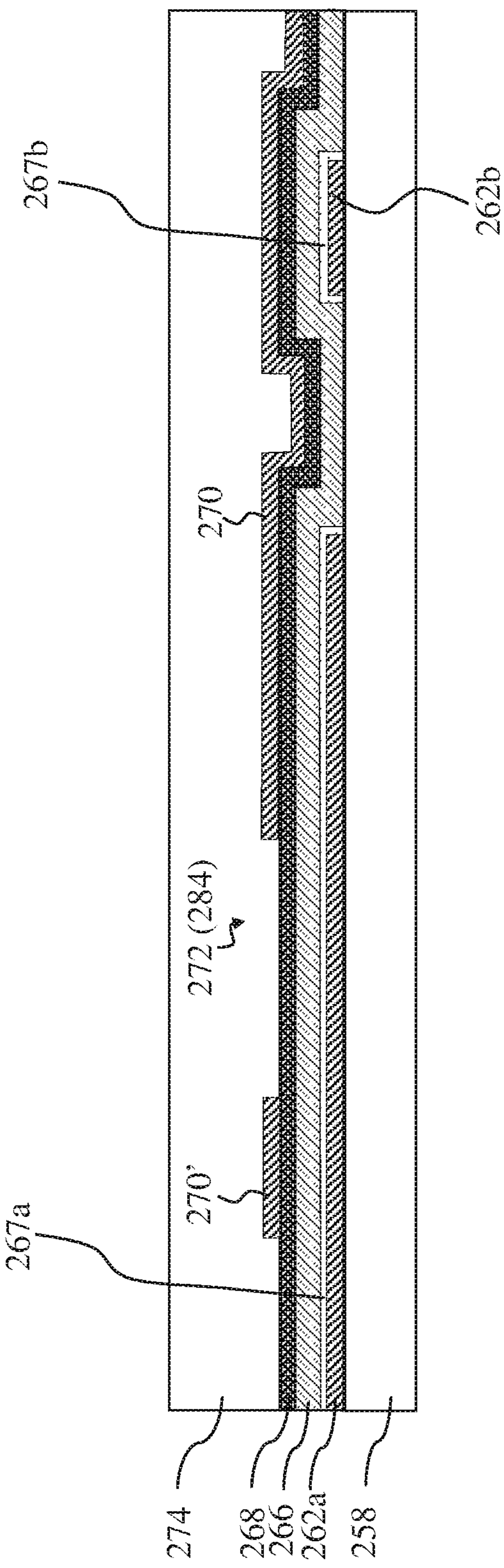
FIG. 19A and FIG. 19B depict fragmentary cross-sectional views of a fourth alternative semiconductor structure and a fifth alternative semiconductor structure, respectively according to various aspects of the present disclosure.
Figure 19B:
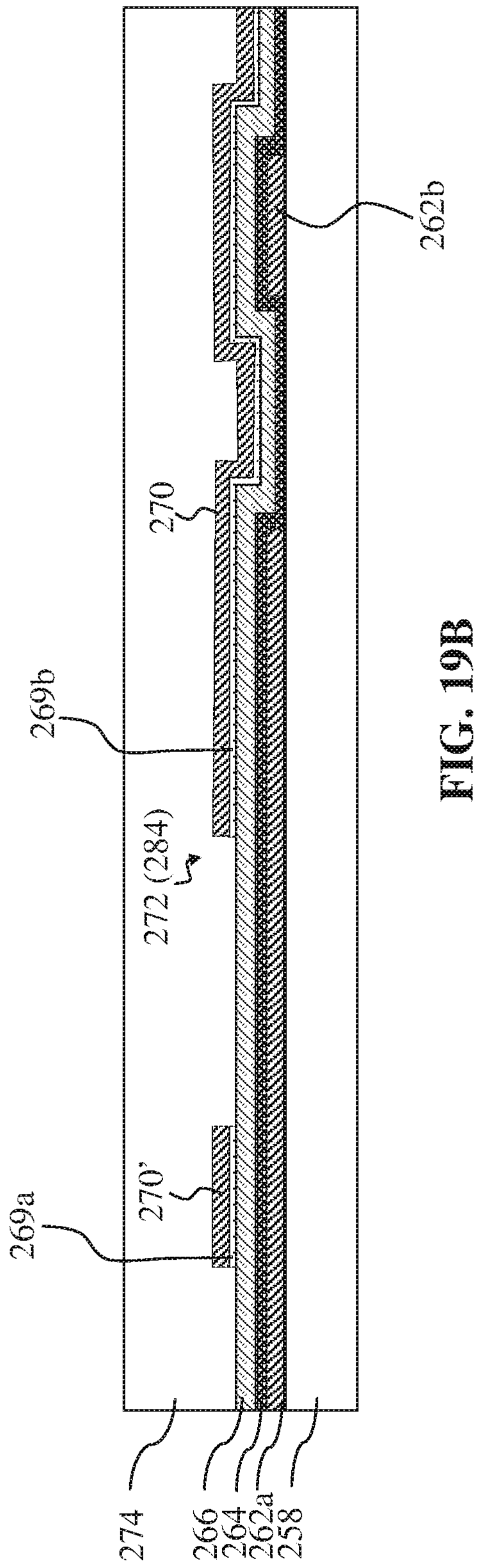

In some alternative embodiments as represented by FIG. 19A and FIG. 19B, one of the conductor plates of the MIM capacitor 272/284 is separated from an adjacent high-K dielectric layer by an ALD-formed metal oxide layer, while another one of the conductor plates of the MIM capacitor 272/284 is separated from an adjacent high-K dielectric layer by a natively-formed metal oxide layer which is not formed by a deposition process. In more detail, as depicted in FIG. 19A, a first alternative structure of the first MIM capacitor 272 is illustrated as an example. The method of forming the first alternative structure of the first MIM capacitor 272 include performing operations in blocks 106, 110, 112, and 114 of method 100, and does not include performing operations in block 108. That is, after forming the first conductor plate 262*a* and the dummy conductive feature 262*b*, the high-K dielectric layer 266 is conformally deposited on the semiconductor structure 200, including on top and sidewall surfaces of the first conductor plate 262*a* and the dummy conductive feature 262*b*, and a portion of the top surface of the first passivation layer 258 not covered by the first conductor plate 262*a* and the dummy conductive feature 262*b*. After forming the high-K dielectric layer 266, the second insulation layer 268 and the second conductor plate 270 are then formed. The metal element of the first conductor plate 262*a* and the dummy conductive feature 262*b* may react with oxygen provided by the high-K dielectric layer 266 formed thereon to form corresponding metal oxide layers at their interfaces. A metal oxide layer 267*a* is formed at the interface between the first conductor plate 262*a* and the high-K dielectric layer 266, and a metal oxide layer 267*b* is formed at the interface between the dummy conductive feature 262*b* and the high-K dielectric layer 266. Other portions of the bottom surface of the high-K dielectric layer 266 are in direct contact with the first passivation layer 258. Since the metal oxide layer 267*a* and the metal oxide layer 267*b* are formed by incomplete chemical reaction, the metal oxide layer 267*a* and the metal oxide layer 267*b* may be non-stoichiometric metal-oxides filled with vacancies, and film qualities of the metal oxide layer 267*a* and the metal oxide layer 267*b* are not as good as the film quality of the ALD-formed metal oxide layer 268. In an embodiment, the density (i.e., number/area) of vacancies of the metal oxide layer 267*a*/267*b* is greater than the density (i.e., number/area) of vacancies of the ALD-formed metal oxide layer 268. For embodiments in which the first conductor plate 262*a* and the dummy conductive feature 262*b* are formed of TiN and the high-K dielectric layer 266 is formed of HZO, the metal oxide layer 267*a* and the metal oxide layer 267*b* may include $TiO_x$, where x is less than 2. For embodiments in which the first conductor plate 262*a* and the dummy conductive feature 262*b* are formed of aluminum and the high-K dielectric layer 266 is formed of HZO, the metal oxide layer 267*a* and the metal oxide layer 267*b* may include $Al_zO_y$, where a ratio of y to x is less than 3/2.

FIG. 19B depicts a second alternative structure of the first MIM capacitor 272. The method of forming the second alternative structure of the first MIM capacitor 272 includes performing operations in blocks 106, 108, 110, and 114 of method 100, and does not include performing operations in block 112. That is, after forming the first conductor plate 262*a* and the dummy conductive feature 262*b*, the first insulation layer 264, and the high-K dielectric layer 266 as described with reference FIG. 1, the second conductor plate 270 and the dummy conductive feature 270' are then formed on the high-K dielectric layer 266. For similar reasons described above, the metal element of the second conductor plate 270 and the dummy conductive feature 270' may react with oxygen provided by the high-K dielectric layer 266 formed thereunder to form corresponding metal oxide layers at their interfaces.

A metal oxide layer 269*a* is formed at the interface between the dummy conductive feature 270' and the high-K dielectric layer 266, and a metal oxide layer 269*b* is formed at the interface between the second conductor plate 270 and the high-K dielectric layer 266. Other portions of the top surface of the high-K dielectric layer 266 are in direct contact with the second passivation layer 274. In this depicted example, the second passivation layer 274 also directly contacts the sidewall surfaces of the dummy conductive feature 270', the metal oxide layer 269*a*, the second conductor plate 270, and the metal oxide layer 269*b*.

Since the metal oxide layers 269*a* and 269*b* are formed by incomplete chemical reaction, the metal oxide layers 269*a* and 269*b* may be non-stoichiometric metal-oxides filled with vacancies, and film qualities of the metal oxide layers 269*a* and 269*b* are not as good as the film quality of the ALD-formed metal oxide layer 264. In an embodiment, the density (i.e., number/area) of vacancies of the metal oxide layer 269*a*/269*b* is greater than the density (i.e., number/area) of vacancies of the ALD-formed metal oxide layer 264. For embodiments in which the second conductor plate 270 and the dummy conductive feature 270' are formed of TiN and the high-K dielectric layer 266 is formed of HZO, the metal oxide layers 269*a* and 269*b* may include $TiO_x$, where x is less than 2. For embodiments in which the second conductor plate 270 and the dummy conductive feature 270' are formed of aluminum and the high-K dielectric layer 266 is formed of HZO, the metal oxide layers 269*a* and 269*b* may include $Al_zO_y$, where a ratio of y to x is less than 3/2. It is noted that the second MIM capacitor 284 may also have the first alternative structure and second alternative structure similar to those of the first MIM capacitor 272. Any combination of one of the three structures of the first MIM capacitor 272 and one of the three structures of the second MIM capacitor 284 are within the scope of the present disclosure. It is also noted that, each of the first MIM capacitor 272 and the second MIM capacitor 284 may include any other suitable number of conductor plates.

Although not intended to be limiting, one or more embodiments of the present disclosure provide many benefits to a semiconductor structure and the formation thereof. For example, the present disclosure provides metal-insulator-metal (MIM) capacitors having an ALD-formed metal oxide layer disposed between a conductor and an adjacent high-K dielectric layer to prevent the formation of a non-stoichiometric metal oxide layer. As a result, TDDB performance of the metal-insulator-metal capacitors may be improved. In some embodiments, forward bias breakdown voltage of the metal-insulator-metal capacitor may also be increased. Thus, the overall performance and reliability of the metal-insulator-metal capacitors may be advantageously improved.

The present disclosure provides for many different embodiments. Semiconductor structures and methods of fabrication thereof are disclosed herein. In one exemplary aspect, the present disclosure is directed to a method. The method includes forming a first metal-insulator-metal (MIM) capacitor over a substrate, wherein the forming of the first MIM capacitor comprises depositing a first conductive material layer over the substrate, the first conductive material layer comprising a first metal element, patterning the first conductive material layer to form a first conductor plate over the substrate, conformally depositing a first dielectric layer over the substrate and on the first conductor plate, the first dielectric layer comprising the first metal element, forming a first high-K dielectric layer on the first dielectric layer, conformally depositing a second dielectric layer over the substrate and on the first high-K dielectric layer, the second dielectric layer comprising a second metal element, and forming a second conductor plate over the second dielectric layer, the second conductor plate comprises the second metal element. The method further comprises forming a second metal-insulator-metal (MIM) capacitor over the first MIM capacitor.

In some embodiments, the first metal element may include aluminum, and the first dielectric layer may include $Al_2O_3$. In some embodiments, the second metal element may include titanium, and the first dielectric layer may include $TiO_2$. In some embodiments, the first high-K dielectric layer may include hafnium-zirconium oxide (HZO). In some embodiments, the second metal element may be different than the first metal element. In some embodiments, the forming of the second MIM capacitor may include forming a third conductor plate comprising a third metal element, depositing a second high-K dielectric layer on the third conductor plate, the second high-K dielectric layer comprising oxygen, conformally depositing a third dielectric layer over the substrate and on the second high-K dielectric layer, and forming a fourth conductor plate on the third dielectric layer, wherein the fourth conductor plate and the third dielectric layer comprise a same fourth metal element. In some embodiments, the oxygen of the second high-K dielectric layer may react with the third metal element of the third conductor plate and form a non-stoichiometric metal oxide layer disposed between the second high-K dielectric layer and the third conductor plate. In some embodiments, the method may also include after the forming of the first MIM capacitor, forming a first passivation layer over the first MIM capacitor, forming a first conductive feature extending through first passivation layer to electrically connect to the first conductor plate and forming a second conductive feature extending through first passivation layer to electrically connect to the second conductor plate, forming a second passivation layer over the first conductive feature and the second conductive feature, after the forming of the second MIM capacitor, forming a third passivation layer over the second MIM capacitor, forming a third conductive feature extending through the third passivation layer to electrically connect to the third conductor plate and the first conductive feature, and forming a fourth conductive feature extending through the third passivation layer to electrically connect to the fourth conductor plate and the second conductive feature. In some embodiments, a ratio of a thickness of the first dielectric layer to a thickness of the first high-K dielectric layer may be in a range between 1/10 and 1/2.

In another exemplary aspect, the present disclosure is directed to a method. The method includes forming a first conductive layer over a substrate, performing a first atomic layer deposition (ALD) process to form a first insulation layer directly on the first conductive layer, conformally forming a high-K dielectric layer on the first insulation layer, performing a second atomic layer deposition (ALD) process to form a second insulation layer over the high-K dielectric layer, and forming a second conductive layer directly on the second insulation layer, wherein the first conductive layer may include aluminum, and the first insulation layer may include $Al_2O_3$.

In some embodiments, the second conductive layer may include aluminum, and the second insulation layer may include $Al_2O_3$. In some embodiments, the second conductive layer may include titanium nitride, and the second insulation layer may include $TiO_2$. In some embodiments, the method may also include forming a passivation structure over the second conductive layer, wherein the passivation structure may include a metal-insulator-metal (MIM) capacitor having a bottom conductor plate and a top conductor plate separated from the bottom conductor plate by a multi-layer dielectric structure. In some embodiments, the multi-layer dielectric structure may include a first metal oxide dielectric layer having a fixed stoichiometric ratio and in direct contact with and disposed on the bottom conductor plate, wherein the first metal oxide dielectric layer and the bottom conductor plate comprise a same metal element. The multi-layer dielectric structure may include a second metal oxide dielectric layer having a fixed stoichiometric ratio and in direct contact with and disposed under the top conductor plate, wherein the second metal oxide dielectric layer and the top conductor plate comprise a same metal element. In some embodiments, the method may also include forming a first conductive feature in direct contact with the first conductive layer and forming a second conductive feature in direct contact with the second conductive layer. In some embodiments, a height of the first conductive feature may be different than a height of the second conductive feature.

In yet another exemplary aspect, the present disclosure is directed to a semiconductor structure. The semiconductor structure includes a first metal-insulator-metal (MIM) capacitor over a substrate and comprising a first conductor plate, a conformal first metal oxide insulation layer over the substrate and on the first conductor plate, a conformal second metal oxide insulation layer over the conformal first metal oxide insulation layer, and a second conductor plate over and in direct contact with the conformal second metal oxide insulation layer and vertically overlapped with the first conductor plate, wherein the first conductor plate includes aluminum, and the first metal oxide insulation layer includes $Al_2O_3$.

In some embodiments, the semiconductor structure may also include a high-K dielectric layer disposed vertically between the first metal oxide insulation layer and the second metal oxide insulation layer. In some embodiments, the second conductor plate may include titanium, and the second metal oxide insulation layer may include $TiO_2$. In some embodiments, the semiconductor structure may also include a first passivation layer over the first MIM capacitor and comprising a planar top surface and a second metal-insulator-metal (MIM) capacitor over the first passivation layer. The second metal-insulator-metal (MIM) capacitor may include a bottom conductor plate over the first passivation layer, a conformal metal oxide dielectric layer over the bottom conductor plate and the first passivation layer, a conformal high-K dielectric layer over the conformal metal oxide dielectric layer, and a top conductor plate over the conformal high-K dielectric layer and vertically overlapped with the bottom conductor plate, wherein an entirety of a bottom surface of the top conductor plate is spaced apart from the conformal high-K dielectric layer by a non-stoichiometric metal oxide layer, the top conductor plate and the non-stoichiometric metal oxide layer comprise a same metal element. The semiconductor structure may also include a second passivation layer over the second MIM capacitor and in direct contact with a sidewall surface of the bottom conductor plate and a sidewall surface of the non-stoichiometric metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first metal-insulator-metal (MIM) capacitor over a substrate, wherein the forming of the first MIM capacitor comprises:

depositing a first conductive material layer over the substrate, the first conductive material layer comprising a first metal element, patterning the first conductive material layer to form a first conductor plate over the substrate, conformally depositing a first dielectric layer over the substrate and on the first conductor plate, the first dielectric layer comprising the first metal element, forming a first high-K dielectric layer on the first dielectric layer, conformally depositing a second dielectric layer over the substrate and on the first high-K dielectric layer, the second dielectric layer comprising a second metal element, and forming a second conductor plate over the second dielectric layer, the second conductor plate comprises the second metal element;

forming a first conductive feature to electrically connect to the first conductor plate and a second conductive feature to electrically connect to the second conductor plate;

forming a second metal-insulator-metal (MIM) capacitor over the first MIM capacitor, wherein the second MIM capacitor comprises a third conductor plate and a fourth conductor plate spaced apart from the third conductor plate;

forming a third conductive feature extending through the second MIM capacitor to electrically connect to the third conductor plate and the first conductive feature; and forming a fourth conductive feature extending through the second MIM capacitor to electrically connect to the fourth conductor plate and the second conductive feature.

2. The method of claim 1, wherein the first metal element comprises aluminum, and the first dielectric layer comprises $Al_2O_3$.

3. The method of claim 1, wherein the second metal element comprises titanium, and the first dielectric layer comprises $TiO_2$.

4. The method of claim 2, wherein the first high-K dielectric layer comprises hafnium-zirconium oxide (HZO).

5. The method of claim 1, wherein the second metal element is different than the first metal element.

6. The method of claim 1, wherein the forming of the second MIM capacitor comprises:

forming the third conductor plate comprising a third metal element;

depositing a second high-K dielectric layer on the third conductor plate, the second high-K dielectric layer comprising oxygen;

conformally depositing a third dielectric layer over the substrate and on the second high-K dielectric layer; and forming the fourth conductor plate on the third dielectric layer, wherein the fourth conductor plate and the third dielectric layer comprise a same fourth metal element.

7. The method of claim 6, wherein the oxygen of the second high-K dielectric layer reacts with the third metal element of the third conductor plate and form a non-stoichiometric metal oxide layer disposed between the second high-K dielectric layer and the third conductor plate.

8. The method of claim 1, wherein a ratio of a thickness of the first dielectric layer to a thickness of the first high-K dielectric layer is in a range between 1/10 and 1/2.

9. The method of claim 1, wherein the third conductive feature and the fourth conductive feature have a substantially same depth, and the first conductive feature and the second conductive feature have different depths.

10. A method, comprising:

forming a first conductive layer over a substrate;

performing a first atomic layer deposition (ALD) process to form a first insulation layer directly on the first conductive layer;

conformally forming a high-K dielectric layer on the first insulation layer, wherein the high-K dielectric layer contains oxygen;

forming a second conductive layer over the high-K dielectric layer; and forming a non-stoichiometric metal oxide layer between the high-K dielectric layer and the second conductive layer, wherein the non-stoichiometric metal oxide layer and the second conductive layer comprise a same metal element.

11. The method of claim 10, wherein the second conductive layer comprises aluminum.

12. The method of claim 10, wherein the second conductive layer comprises titanium nitride.

13. The method of claim 10, further comprising:

forming a passivation structure over the second conductive layer, wherein the passivation structure comprises a metal-insulator-metal (MIM) capacitor having a bottom conductor plate and a top conductor plate separated from the bottom conductor plate by a multi-layer dielectric structure.

14. The method of claim 13, wherein the same metal element is a first same metal element, wherein the multi-layer dielectric structure comprises:

a first metal oxide dielectric layer having a fixed stoichiometric ratio and in direct contact with and disposed on the bottom conductor plate, wherein the first metal oxide dielectric layer and the bottom conductor plate comprise a same second metal element; and a second metal oxide dielectric layer having a fixed stoichiometric ratio and in direct contact with and disposed under the top conductor plate, wherein the second metal oxide dielectric layer and the top conductor plate comprise a same third metal element.

15. The method of claim 13, further comprising:

forming a first conductive feature in direct contact with the first conductive layer; and forming a second conductive feature in direct contact with the second conductive layer.

16. The method of claim 15, wherein a height of the first conductive feature is different than a height of the second conductive feature.

17. A semiconductor structure, comprising:

a first metal-insulator-metal (MIM) capacitor over a substrate, the first MIM capacitor comprising:

a first conductor plate, a conformal first metal oxide insulation layer over the substrate and on the first conductor plate, a conformal second metal oxide insulation layer over the conformal first metal oxide insulation layer, a second conductor plate over the conformal second metal oxide insulation layer and vertically overlapped with the first conductor plate, and a non-stoichiometric metal oxide layer between the conformal second metal oxide insulation layer and the second conductor plate.

18. The semiconductor structure of claim 17, wherein the conformal second metal oxide insulation layer is a high-K dielectric layer.

19. The semiconductor structure of claim 17, wherein the second conductor plate comprises titanium, and the non-stoichiometric metal oxide layer comprises TiOx, wherein x is a number less than 2.

20. The semiconductor structure of claim 17, further comprising:

a first passivation layer over the first MIM capacitor and comprising a planar top surface;

a second metal-insulator-metal (MIM) capacitor over the first passivation layer and comprising:

a bottom conductor plate over the first passivation layer, a conformal metal oxide dielectric layer over the bottom conductor plate and the first passivation layer, a conformal high-K dielectric layer over the conformal metal oxide dielectric layer, and a top conductor plate over the conformal high-K dielectric layer and vertically overlapped with the bottom conductor plate, wherein an entirety of a bottom surface of the top conductor plate is spaced apart from the conformal high-K dielectric layer by a non-stoichiometric metal oxide layer, wherein the top conductor plate and the non-stoichiometric metal oxide layer comprise a same metal element; and a second passivation layer over the second MIM capacitor and in direct contact with a sidewall surface of the bottom conductor plate and a sidewall surface of the non-stoichiometric metal oxide layer.

* * * * *